(12) United States Patent
Foucher et al.

(10) Patent No.: US 6,187,512 B1
(45) Date of Patent: Feb. 13, 2001

(54) PROCESS FOR HALOMETHYLATION OF HIGH PERFORMANCE POLYMERS

(75) Inventors: Daniel A. Foucher, Toronto (CA); Nancy C. Stoffel; Roger T. Janezic, both of Rochester, NY (US); Thomas W. Smith, Penfield, NY (US); David J. Luca, Rochester, NY (US); Bidan Zhang, Beacon, NY (US)

(73) Assignee: Xerox Corporation, Stamford, CT (US)

( * ) Notice: Under 35 U.S.C. 154(b), the term of this patent shall be extended for 0 days.

(21) Appl. No.: 09/313,501

(22) Filed: May 17, 1999

(51) Int. Cl.$^7$ .............................. G03C 5/56; C08G 8/02; C08G 14/00; G03F 7/26

(52) U.S. Cl. .................. 430/311; 430/270.1; 430/286.1; 522/71; 522/162; 522/163; 522/164; 522/165; 522/166; 528/125; 528/126; 528/127; 528/128; 528/174; 528/176; 528/373; 528/423

(58) Field of Search .................. 430/311, 270.1, 430/286.1; 427/511; 522/71, 162, 163, 164, 165, 166; 524/167, 284, 745, 765; 528/125, 126, 127, 128, 174, 176, 373, 401, 405, 423; 525/437, 471, 534, 535, 536, 540

(56) References Cited

U.S. PATENT DOCUMENTS

| | | | |
|---|---|---|---|
| 4,739,032 | 4/1988 | Jones | 528/230 |
| 5,739,254 | 4/1998 | Fuller et al. | 528/125 |
| 5,753,783 | 5/1998 | Fuller et al. | 525/471 |
| 5,761,809 | 6/1998 | Fuller et al. | 29/894 |
| 5,863,963 | 1/1999 | Narang et al. | 522/162 |
| 6,020,119 * | 2/2000 | Foucher et al. | 430/627 |
| 6,090,453 * | 7/2000 | Narang et al. | 427/504 |

OTHER PUBLICATIONS

Daly, "Chloromethylation of Condensation Polymers Containing an Oxy–1,4–Phenylene Backbone," Polymers Preprints (1979), vol. 20, No. 1, pp. 835–837.

Camps, "Chloromethylstyrene: Synthesis, Polymerization, Transformations, Applications," JMS–REV. Macromol, Chem. Phys., C22(3), 343–407 (1982–83).

Tabata, "Pulse Radiolysis Studies on the Mechanism of the High Sensitivity of Chloromethylated Polystyrene as an Electron Negative Resist," 1984pp. 287–288.

Jurek, "Deep UV Photochemistry of Copolymers of Trimethylsilymethyl Methacrylate and Chloromethylstyrene," Polymer Preprints, 1988, pp. 546–547.

Percec, "Functional Polymers and Sequential Copolymers by Phase Transfer Catalysis, 2a)," Makromal Chem., 1984, pp. 1867–1880.

Percec, "Functional Polymers and Sequential Copolymers by Phase Transfer Catalysis, 3a)," Makronal Chem., 1984, pp. 2319–2336.

Percec, "Functional Polymers and Sequential Copolymers by Phase Transfer Catalysis 4. A New and Convenient Synthesis of p– and m–Hydrozymethylphenylacetylene," Polymer Bulletin 10, 223–230, 1983.

Amato, "A New Preparation of Chloromethyl Methy Ether Free of Bis(chloromethyl) Ether," 1979 Georg Thieme Publishers.

McKillop, "A Simple and Inexpensive Procedure for Chloromethylation of Certain Aromatic Compounds," Tetrahedron Letters, vol. 24, No. 18, 1983, pp. 1933–1936.

Tepenitsyna, "Synthesis of Intermediates for Production of Heat Resistant Polymers (Chloromethylation of Diphenyl Oxide)," Zhurnal Prikladnoi Khimii, vol. 40, No. 11, Nov. 1967, pp. 2540–2546.

\* cited by examiner

*Primary Examiner*—Shean C. Wu
(74) *Attorney, Agent, or Firm*—Judith L. Byorick

(57) ABSTRACT

Disclosed is a process which comprises reacting a polymer of the general formula

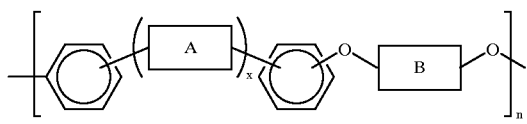

or

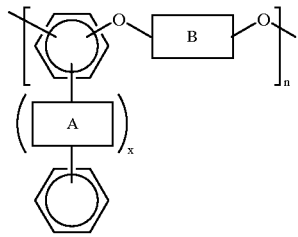

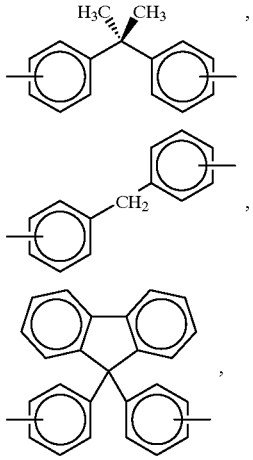

wherein x is an integer of 0 or 1, A is one of several specified groups, such as

B is one of several specified groups, such as or mixtures thereof, and n is an integer representing the number of repeating monomer units, with a halomethyl alkyl ether, an acetyl halide, and methanol in the presence of a halogen-containing Lewis acid catalyst, thereby forming a halomethylated polymer.

33 Claims, 3 Drawing Sheets

PROCESS FOR HALOMETHYLATION OF HIGH PERFORMANCE POLYMERS

BACKGROUND OF THE INVENTION

The present invention is directed to a process for preparing halomethylated high performance polymers and to methods for making photoresists with curable derivatives of these polymers. The present invention is also directed to processes for preparing improved photoresist compositions and improved thermal ink jet printheads with these polymers. One embodiment of the present invention is directed to a process which comprises reacting a polymer of the general formula

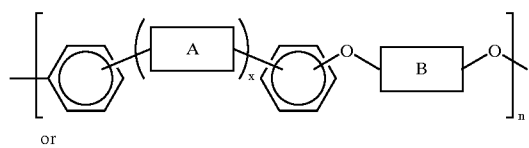

or

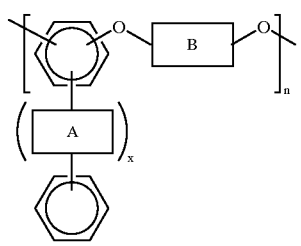

wherein x is an integer of 0 or 1, A is

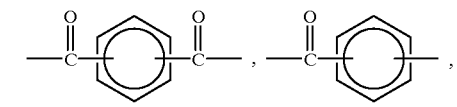

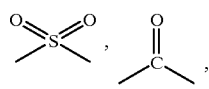

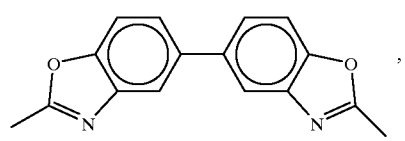

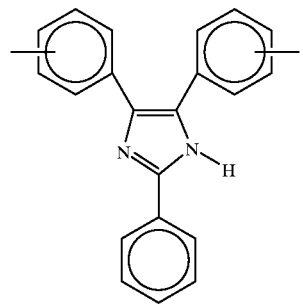

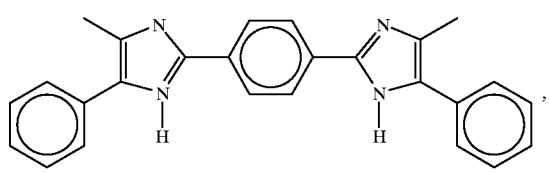

—O—, —C(CH$_3$)$_2$—, or mixtures thereof, B is

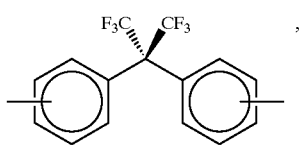

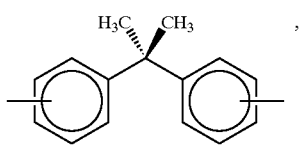

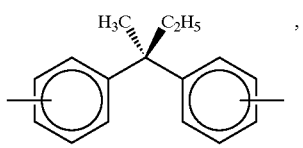

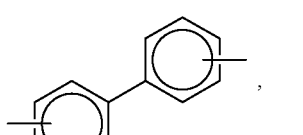

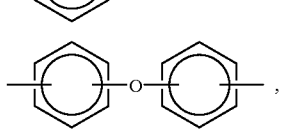

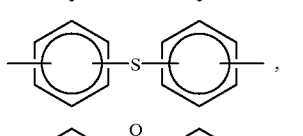

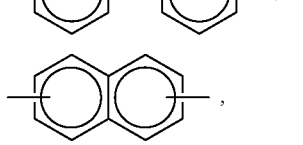

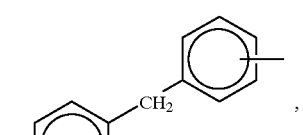

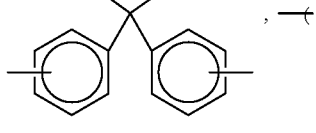

wherein v is an integer of from 1 to about 20,

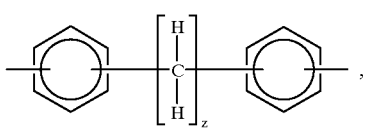

wherein z is an integer of from 2 to about 20,

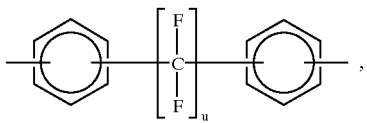

wherein u is an integer of from 1 to about 20,

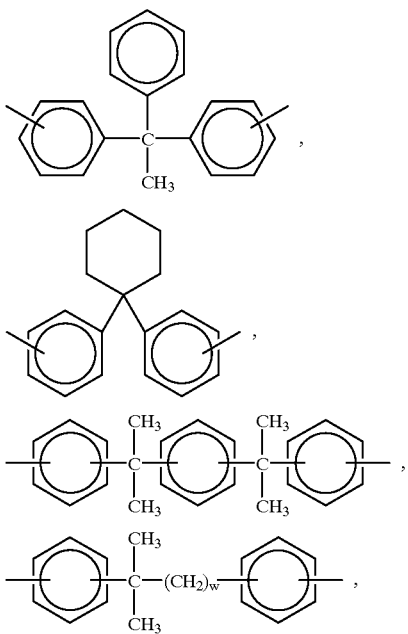

wherein w is an integer of from 1 to about 20,

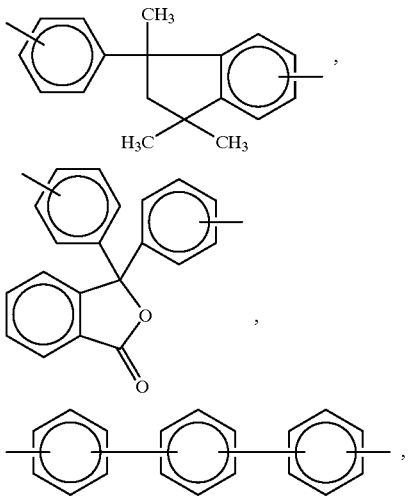

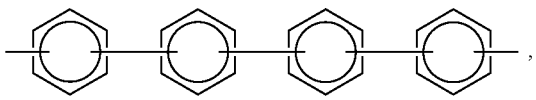

or mixtures thereof, and n is an integer representing the number of repeating monomer units, with a halomethyl alkyl ether, an acetyl halide, and methanol in the presence of a halogen-containing Lewis acid catalyst, thereby forming a halomethylated polymer. Another embodiment of the present invention is directed to a process which comprises preparing a halomethylated polymer by the aforementioned process and subsequently converting at least some of the halomethyl groups to photosensitivity-imparting groups which enable crosslinking or chain extension of the polymer upon exposure to actinic radiation, thereby forming a photopatternable polymer. Yet another embodiment of the present invention is directed to an ink jet printhead containing a halomethylated polymer made by the aforementioned process. Still another embodiment of the present invention is directed to processes which comprise causing the either the halomethylated polymer or the photosensitivity-imparting group substituted polymer to become crosslinked or chain extended by imagewise exposure to actinic radiation in an image pattern.

In microelectronics applications, there is a great need for low dielectric constant, high glass transition temperature, thermally stable, photopatternable polymers for use as interlayer dielectric layers and as passivation layers which protect microelectronic circuitry. Poly(imides) are widely used to satisfy these needs; these materials, however, have disadvantageous characteristics such as relatively high water sorption and hydrolytic instability. There is thus a need for high performance polymers which can be effectively photopatterned and developed at high resolution.

One particular application for such materials is the fabrication of ink jet printheads. Ink jet printing systems generally are of two types: continuous stream and drop-on-demand. In continuous stream ink jet systems, ink is emitted in a continuous stream under pressure through at least one orifice or nozzle. The stream is perturbed, causing it to break up into droplets at a fixed distance from the orifice. At the break-up point, the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, the system is much simpler than the continuous stream type. There are different types of drop-on-demand ink jet systems. One type of drop-on-demand system has as its major components an ink filled channel or passageway having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high quality copies. Drop-on-demand systems which use piezoelectric devices to expel the droplets also suffer the disadvantage of a slow printing speed.

The other type of drop-on-demand system is known as thermal ink jet, or bubble jet, and produces high velocity droplets and allows very close spacing of nozzles. The major components of this type of drop-on-demand system are an ink filled channel having a nozzle on one end and a heat generating resistor near the nozzle. Printing signals representing digital information originate an electric current pulse in a resistive layer within each ink passageway near the orifice or nozzle, causing the ink in the immediate vicinity to vaporize almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles, commonly referred to as the "bubble jet" system, the drop-on-demand ink jet printers provide simpler, lower cost devices than their continuous stream counterparts, and yet have substantially the same high speed printing capability.

The operating sequence of the bubble jet system begins with a current pulse through the resistive layer in the ink filled channel, the resistive layer being in close proximity to the orifice or nozzle for that channel. Heat is transferred from the resistor to the ink. The ink becomes superheated far above its normal boiling point, and for water based ink, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to heat of vaporization. The expansion of the bubble forces a droplet of ink out of the nozzle, and once the excess heat is removed, the bubble collapses. At this point, the resistor is no longer being heated because the current pulse has passed and, concurrently with the bubble collapse, the droplet is propelled at a high rate of speed in a direction towards a recording medium. The surface of the printhead encounters a severe cavitational force by the collapse of the bubble, which tends to erode it. Subsequently, the ink channel refills by capillary action. This entire bubble formation and collapse sequence occurs in about 10 microseconds. The channel can be refired after 100 to 500 microseconds minimum dwell time to enable the channel to be refilled and to enable the dynamic refilling factors to become somewhat dampened. Thermal ink jet equipment and processes are well known and are described in, for example, U.S. Pat. Nos. 4,601,777, 4,251,824, 4,410,899, 4,412,224, 4,532,530, and 4,774,530, the disclosures of each of which are totally incorporated herein by reference.

The present invention is suitable for ink jet printing processes, including drop-on-demand systems such as thermal ink jet printing, piezoelectric drop-on-demand printing, and the like.

In ink jet printing, a printhead is usually provided having one or more ink-filled channels communicating with an ink supply chamber at one end and having an opening at the opposite end, referred to as a nozzle. These printheads form images on a recording medium such as paper by expelling droplets of ink from the nozzles onto the recording medium. The ink forms a meniscus at each nozzle prior to being expelled in the form of a droplet. After a droplet is expelled, additional ink surges to the nozzle to reform the meniscus.

In thermal ink jet printing, a thermal energy generator, usually a resistor, is located in the channels near the nozzles a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. The rapidly expanding vapor bubble pushes the column of ink filling the channel towards the nozzle. At the end of the current pulse the heater rapidly cools and the vapor bubble begins to collapse. However, because of inertia, most of the column of ink that received an impulse from the exploding bubble continues its forward motion and is ejected from the nozzle as an ink drop. As the bubble begins to collapse, the ink still in the channel between the nozzle and bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity of the droplet in a substantially straight line direction towards a recording medium, such as paper.

Ink jet printheads include an array of nozzles and may, for example, be formed of silicon wafers using orientation dependent etching (ODE) techniques. The use of silicon wafers is advantageous because ODE techniques can form structures, such as nozzles, on silicon wafers in a highly precise manner. Moreover, these structures can be fabricated efficiently at low cost. The resulting nozzles are generally triangular in cross-section. Thermal ink jet printheads made by using the above-mentioned ODE techniques typically comprise a channel plate which contains a plurality of nozzle-defining channels located on a lower surface thereof bonded to a heater plate having a plurality of resistive heater elements formed on an upper surface thereof and arranged so that a heater element is located in each channel. The upper surface of the heater plate typically includes an insulative layer which is patterned to form recesses exposing the individual heating elements. This insulative layer is referred to as a "pit layer" and is sandwiched between the channel plate and heater plate. For examples of printheads employing this construction, see U.S. Pat. Nos. 4,774,530 and 4,829,324, the disclosures of each of which are totally incorporated herein by reference. Additional examples of thermal ink jet printheads are disclosed in, for example, U.S. Pat. Nos. 4,835,553, 5,057,853, and 4,678,529, the disclosures of each of which are totally incorporated herein by reference.

The photopatternable polymers prepared by the process of the present invention are also suitable for other photoresist applications, including other microelectronics applications, printed circuit boards, lithographic printing processes, interlayer dielectrics, and the like.

U.S. Pat. No. 5,739,254, filed Aug. 29, 1996, and U.S. Pat. No. 5,753,783, filed Aug. 28, 1997, entitled "Process for Haloalkylation of High Performance Polymers," with the named inventors Timothy J. Fuller, Ram S. Narang, Thomas W. Smith, David J. Luca, and Raymond K. Crandall, the disclosures of each of which are totally incorporated herein by reference, disclose a process which comprises reacting a polymer of the general formula

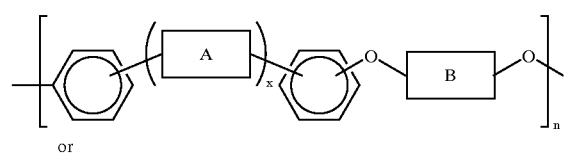

or

-continued

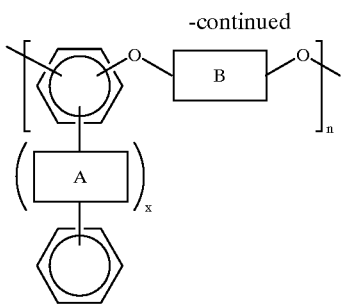

wherein x is an integer of 0 or 1, A is one of several specified groups, such as

B is one of several specified groups, such as

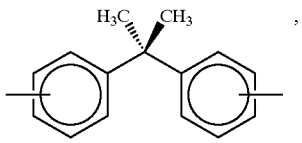

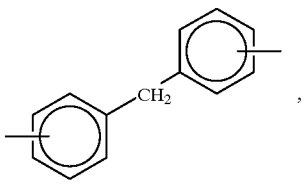

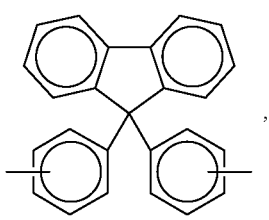

or mixtures thereof, and n is an integer representing the number of repeating monomer units, with an acetyl halide and dimethoxymethane in the presence of a halogen-containing Lewis acid catalyst and methanol, thereby forming a haloalkylated polymer. In a specific embodiment, the haloalkylated polymer is then reacted further to replace at least some of the haloalkyl groups with photosensitivity-imparting groups. Also disclosed is a process for preparing a thermal ink jet printhead with the aforementioned polymer.

U.S. Pat. No. 5,761,809, filed Aug. 29, 1996, entitled "Processes for Substituting Haloalkylated Polymers With Unsaturated Ester, Ether, and Alkylcarboxymethylene Groups," with the named inventors Timothy J. Fuller, Ram S. Narang, Thomas W. Smith, David J. Luca, and Raymond K. Crandall, the disclosure of which is totally incorporated herein by reference, disclose a process which comprises reacting a haloalkylated aromatic polymer with a material selected from the group consisting of unsaturated ester salts, alkoxide salts, alkylcarboxylate salts, and mixtures thereof, thereby forming a curable polymer having functional groups corresponding to the selected salt. Another embodiment of the invention is directed to a process for preparing an ink jet printhead with the curable polymer thus prepared.

U.S. Pat. No. 5,863,963, filed Aug. 29, 1996, and Copending application U.S. Ser. No. 09/163,672, filed Sep. 30, 1998, now U.S. Pat. No. 6,090,453, entitled "Halomethylated High Performance Curable Polymers," with the named inventors Ram S. Narang and Timothy J. Fuller, the disclosures of each of which are totally incorporated herein by reference, disclose a process which comprises the steps of (a) providing a polymer containing at least some monomer repeat units with halomethyl group substituents which enable crosslinking or chain extension of the polymer upon exposure to a radiation source which is electron beam radiation, x-ray radiation, or deep ultraviolet radiation, said polymer being of the formula

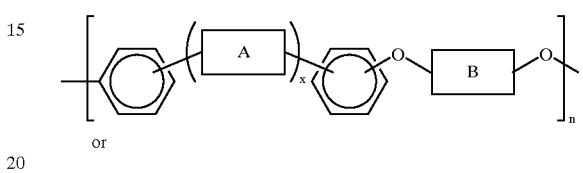

or

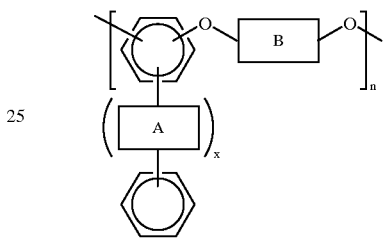

wherein x is an integer of 0 or 1, A is one of several specified groups, such as

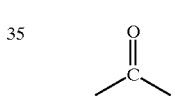

B is one of several specified groups, such as

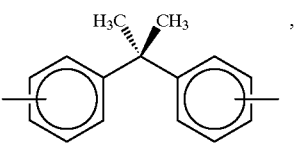

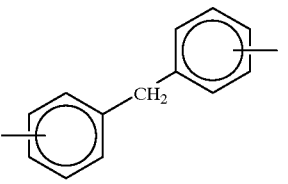

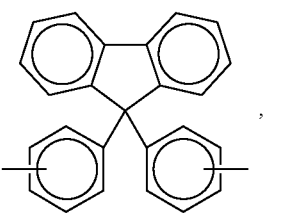

or mixtures thereof, and n is an integer representing the number of repeating monomer units, and (b) causing the polymer to become crosslinked or chain extended through the photosensitivity-imparting groups. Also disclosed is a process for preparing a thermal ink jet printhead by the aforementioned curing process.

"Chloromethylation of Condensation Polymers Containing an oxy-1,4-phenylene Backbone," W. H. Daly et al., *Polymer Preprints*, Vol. 20, No. 1, 835 (1979), the disclosure of which is totally incorporated herein by reference, discloses the chloromethylation of polymers containing oxyphenylene repeat units to produce film forming resins with high chemical reactivity. The utility of 1,4-bis(chloromethoxy)butane and 1-chloromethoxy-4-chlorobutane as chloromethylating agents are also described.

M. Camps, M. Chatzopoulos, and J. Montheard, "Chloromethyl Styrene: Synthesis, Polymerization, Transformations, Applications," *JMS—Rev. Macromol. Chem. Phys.*, C22(3), 343–407 (1982–3), the disclosure of which is totally incorporated herein by reference, discloses processes for the preparation of chloromethyl-substituted polystyrenes, as well as applications thereof.

Y. Tabata, S. Tagawa, and M. Washio, "Pulse Radiolysis Studies on the Mechanism of the High Sensitivity of Chloromethylated Polystyrene as an Electron Negative Resist," *Lithography*, 25(1), 287 (1984), the disclosure of which is totally incorporated herein by reference, discloses the use of chloromethylated polystyrene in resist applications.

M. J. Jurek, A. E. Novembre, I. P. Heyward, R. Gooden, and E. Reichmanis, "Deep UV Photochemistry of Copolymers of Trimethyl-Silylmethyl Methacrylate and Chloromethylstyrene," *Polymer Preprints*, 29(1) (1988), the disclosure of which is totally incorporated herein by reference, discloses the use of an organosilicon polymer of chloromethylstyrene for resist applications.

"Functional Polymers and Sequential Copolymers by Phase Transfer Catalysis, 3a: Synthesis and Characterization of Aromatic Poly(ether sulfone)s and Poly(oxy-2,6-dimethyl-1,4-phenylene) Containing Pendent Vinyl Groups," V. Percec and B. C. Auman, *Makromol. Chem.*, 185, 2319–2336 (1984), the disclosure of which is totally incorporated herein by reference, discloses a method for the syntheses of α,ω-benzyl aromatic poly(ether sulfone)s (PSU) and poly(oxy-2,6-dimethyl-1,4-phenylene) (POP) containing pendant vinyl groups. The first step of the synthetic procedure entails the chloromethylation of PSU and POP to provide polymers with chloromethyl groups. POP, containing bromomethyl groups, was obtained by radical bromination of the methyl groups. Both chloromethylated and bromomethylated starting materials were transformed into their phosphonium salts, and then subjected to a phase transfer catalyzed Wittig reaction to provide polymers with pendant vinyl groups. A PSU with pendant ethynyl groups was prepared by bromination of the PSU containing vinyl groups, followed by a phase transfer catalyzed dehydrobromination. DSC of the thermal curing of the polymers containing pendant vinyl and ethynyl groups showed that the curing reaction is much faster for the polymers containing vinyl groups. The resulting network polymers are flexible when the starting polymer contains vinyl groups, and very rigid when the starting polymer contains ethynyl groups.

"Functional Polymers and Sequential Copolymers by Phase Transfer Catalysis," V. Percec and P. L. Rinaldi, *Polymer Bulletin*, 10, 223 (1983), the disclosure of which is totally incorporated herein by reference, discloses the preparation of p- and m-hydroxymethylphenylacetylenes by a two step sequence starting from a commercial mixture of p- and m-chloromethylstyrene, i.e., by the bromination of the vinylic monomer mixture followed by separation of m- and p-brominated derivatives by fractional crystallization, and simultaneous dehydrobromination and nucleophilic substitution of the —Cl with —OH.

J. S. Amato, S. Karady, M. Sletzinger, and L. M. Weinstock, "A New Preparation of Chloromethyl Methyl Ether Free of Bis(chloromethyl) Ether," *Synthesis*, 970 (1979), the disclosure of which is totally incorporated herein by reference, discloses the synthesis of chloromethyl methyl ether by the addition of acetyl chloride to a slight excess of anhydrous dimethoxymethane containing a catalytic amount of methanol at room temperature. The methanol triggers a series of reactions commencing with formation of hydrogen chloride and the reaction of hydrogen chloride with dimethoxymethane to form chloromethyl methyl ether and methanol in an equilibrium process. After 36 hours, a near-quantitative conversion to an equimolar mixture of chloromethyl methyl ether and methyl acetate is obtained.

A. McKillop, F. A. Madjdabadi, and D. A. Long, "A Simple and Inexpensive Procedure for Chloromethylation of Certain Aromatic Compounds," *Tetrahedron Letters*, Vol. 24, No. 18, pp. 1933–1936 (1983), the disclosure of which is totally incorporated herein by reference, discloses the reaction of a range of aromatic compounds with methoxyacetyl chloride and aluminum chloride in either nitromethane or carbon disulfide to result in chloromethylation in good to excellent yield.

E. P. Tepenitsyna, M. I. Farberov, and A. P. Ivanovskii, "Synthesis of Intermediates for Production of Heat Resistant Polymers (Chloromethylation of Diphenyl Oxide)," *Zhurnal Prikladnoi Khimii*, Vol. 40, No. 11, pp. 2540–2546 (1967), the disclosure of which is totally incorporated herein by reference, discloses the chloromethylation of diphenyl oxide by (1) the action of paraformaldehyde solution in glacial acetic acid saturated with hydrogen chloride, and by (2) the action of paraformaldehyde solution in concentrated hydrochloric acid.

Copending application U.S. Ser. No. 09/312,720, now U.S. Pat. No. 6,020,119, filed concurrently herewith, entitled "Improved Process for Halomethylation of High Performance Polymers," with the named inventors Daniel A. Foucher, Nancy C. Stoffel, Roger T. Janezic, Thomas W. Smith, David J. Luca, and Bidan Zhang, the disclosure of which is totally incorporated herein by reference, discloses a process which comprises reacting a polymer of the general formula

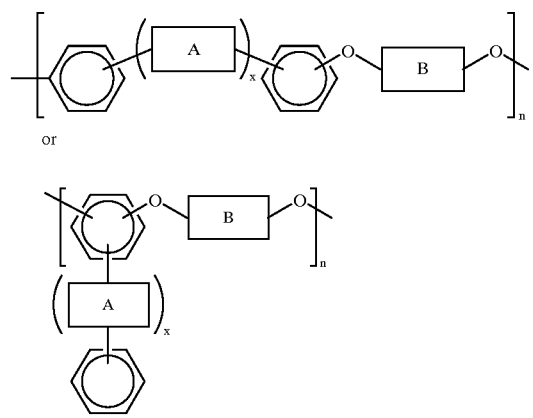

wherein x is an integer of 0 or 1, A is one of several specified groups, such as

B is one of several specified groups, such as

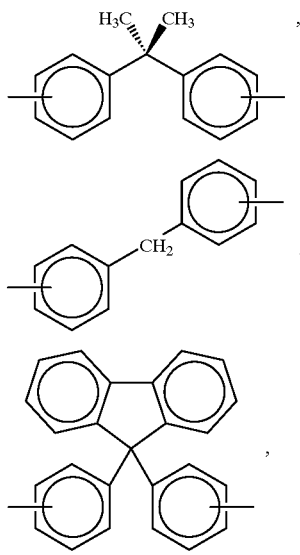

or mixtures thereof, and n is an integer representing the number of repeating monomer units, with a halomethyl alkyl ether, a hydrohalic acid, and acetic acid in the presence of a halogen-containing Lewis acid catalyst, thereby forming a halomethylated polymer.

While known compositions and processes are suitable for their intended purposes, a need remains for improved materials suitable for microelectronics applications. A need also remains for improved ink jet printheads. Further, there is a need for photopatternable polymeric materials which are heat stable, electrically insulating, and mechanically robust. Additionally, there is a need for photopatternable polymeric materials which are chemically inert with respect to the materials that might be employed in ink jet ink compositions. There is also a need for photopatternable polymeric materials which exhibit low shrinkage during post-cure steps in microelectronic device fabrication processes. In addition, a need remains for photopatternable polymeric materials which exhibit a relatively long shelf life. Further, there is a need for photopatternable polymeric materials which can be patterned with relatively low photo-exposure energies. Additionally, a need remains for photopatternable polymeric materials which, in the cured form, exhibit good solvent resistance. There is also a need for photopatternable polymeric materials which, when applied to microelectronic devices by spin casting techniques and cured, exhibit reduced edge bead and no apparent lips and dips. Further, a need remains for processes for preparing photopatternable polymeric materials with high aspect ratios at high resolutions by the incorporation of polymerizable groups and/or cross-linking sites pendant to the polymers. Additionally, there is a need for processes for preparing photopatternable polymers having photosensitive groups pendant to the polymer chains and processes for preparing intermediate materials in the synthesis of photopatternable polymers having photosensitive groups pendant to the polymer chains. There is also a need for processes for preparing photopatternable polymers having halomethyl groups pendant to the polymer chains. Further, a need remains for processes for preparing polymers having halomethyl groups pendant to the polymer chains by methods which do not require the use of hazardous materials such as bis-chloromethyl ether. In addition, there remains a need for photopatternable polymeric materials which have relatively low dielectric constants. Further, there is a need for photopatternable polymeric materials which exhibit reduced water sorption. Additionally, a need remains for photopatternable polymeric materials which exhibit improved hydrolytic stability, especially upon exposure to alkaline solutions. A need also remains for photopatternable polymeric materials which are stable at high temperatures, typically greater than about 150° C. There is also a need for photopatternable polymeric materials which either have high glass transition temperatures or are sufficiently crosslinked that there are no low temperature phase transitions subsequent to photoexposure. Further, a need remains for photopatternable polymeric materials with low coefficients of thermal expansion. There is a need for polymers which are thermally stable, patternable as thick films of about 30 microns or more, exhibit low $T_g$ prior to photoexposure, have low dielectric constants, are low in water absorption, have low coefficients of expansion, have desirable mechanical and adhesive characteristics, and are generally desirable for interlayer dielectric applications, including those at high temperatures, which are also photopatternable. There is also a need for photoresist compositions with good to excellent processing characteristics. In addition, there is a need for processes for preparing polymers having halomethyl groups pendant to the polymer chains by methods which can be carried out at room temperature. Further, there is a need for processes for preparing polymers having halomethyl groups pendant to the polymer chains by methods which do not generate hazardous or toxic materials in situ. Additionally, there is a need for processes for preparing polymers having halomethyl groups pendant to the polymer chains by methods which can be scaled up to generate large, industrial-scale amounts of materials. A need also remains for processes for preparing polymers having halomethyl groups pendant to the polymer chains by methods which do not require the use of toxic solvents. In addition, a need remains for processes for preparing polymers having halomethyl groups pendant to the polymer chains by methods which do not use volatile chloromethylating agents. Further, a need remains for processes for preparing polymers having halomethyl groups pendant to the polymer chains by methods which do not result in undesirably large increases in the molecular weight of the polymer. Additionally, a need remains for processes for preparing polymers having halomethyl groups pendant to the polymer chains by methods which do not result in premature crosslinking of the polymer. There is also a need for processes for preparing polymers having halomethyl groups pendant to the polymer chains by methods which enable production of halomethylated polymers with desirable polydispersity values. In addition, there is a need for processes for preparing polymers having halomethyl groups pendant to the polymer chains by methods which enable production of polymers with a desirably high degree of substitution with halomethyl groups within a reasonable period of time.

SUMMARY OF THE INVENTION

The present invention is directed to a process which comprises reacting a polymer of the general formula

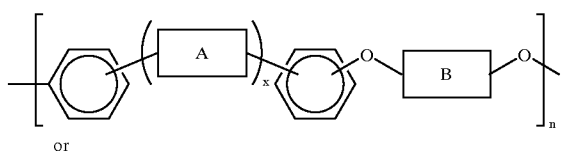
or
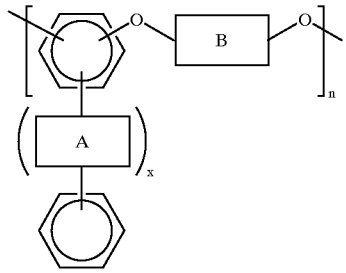
wherein x is an integer of 0 or 1, A is
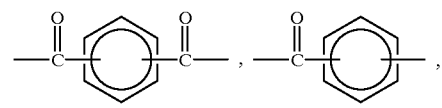
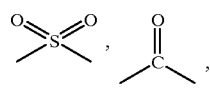
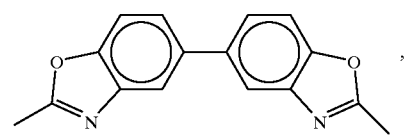
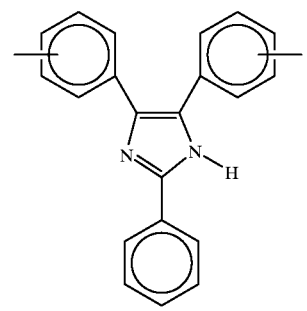
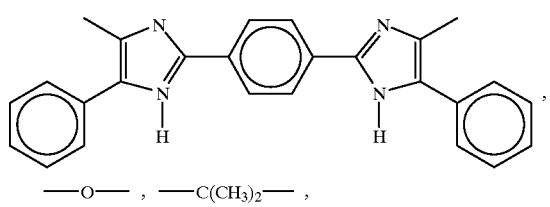
—O—, —C(CH$_3$)$_2$—,
or mixtures thereof, B is
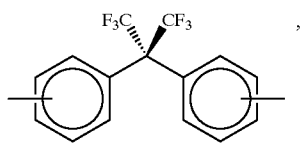
-continued
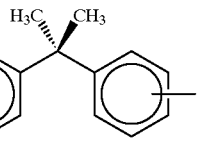
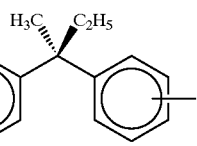
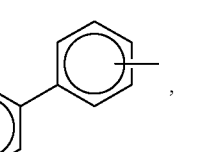
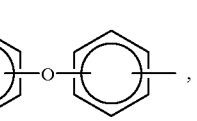
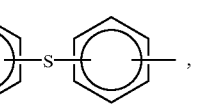
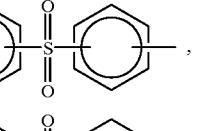
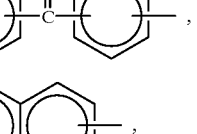
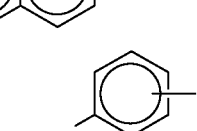
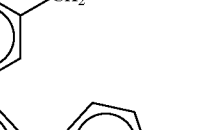
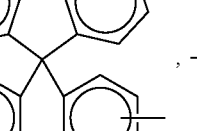
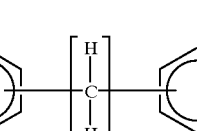
wherein v is an integer of from 1 to about 20,
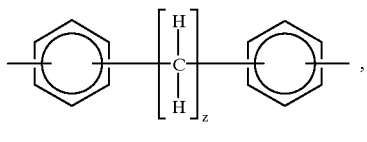

wherein z is an integer of from 2 to about 20,

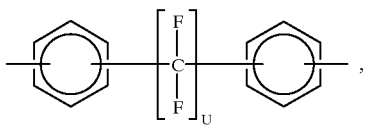

wherein u is an integer of from 1 to about 20,

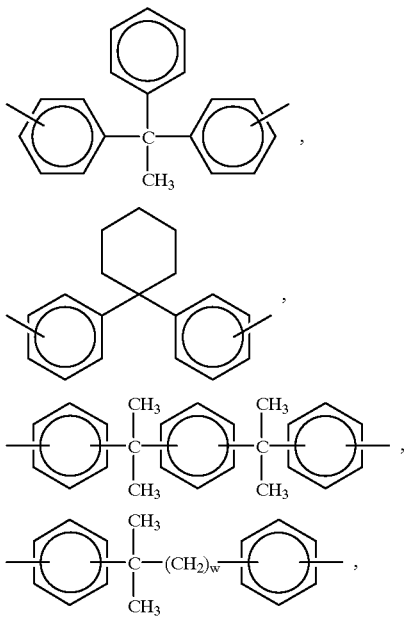

wherein w is an integer of from 1 to about 20,

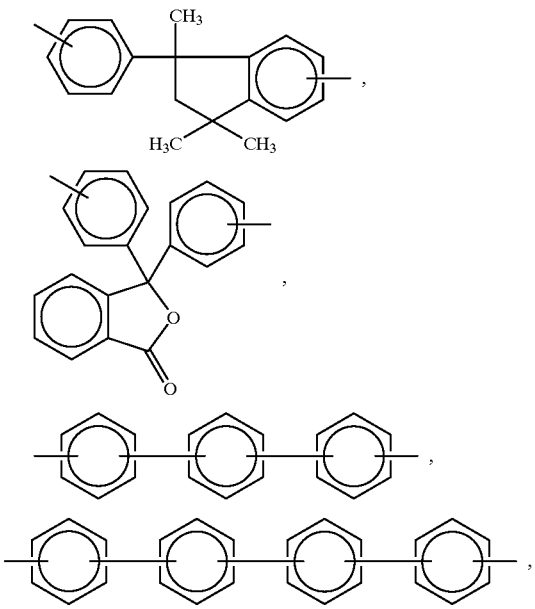

or mixtures thereof, and n is an integer representing the number of repeating monomer units, with a halomethyl alkyl ether, an acetyl halide, and methanol in the presence of a halogen-containing Lewis acid catalyst, thereby forming a halomethylated polymer. Another embodiment of the present invention is directed to a process which comprises preparing a halomethylated polymer by the aforementioned process and subsequently converting at least some of the halomethyl groups to photosensitivity-imparting groups which enable crosslinking or chain extension of the polymer upon exposure to actinic radiation, thereby forming a photopatternable polymer. Yet another embodiment of the present invention is directed to an ink jet printhead containing a halomethylated polymer made by the aforementioned process. Still another embodiment of the present invention is directed to processes which comprise causing the either the halomethylated polymer or the photosensitivity-imparting group substituted polymer to become crosslinked or chain extended by imagewise exposure to actinic radiation in an image pattern.

DETAILED DESCRIPTION OF THE INVENTION

Figure 1:
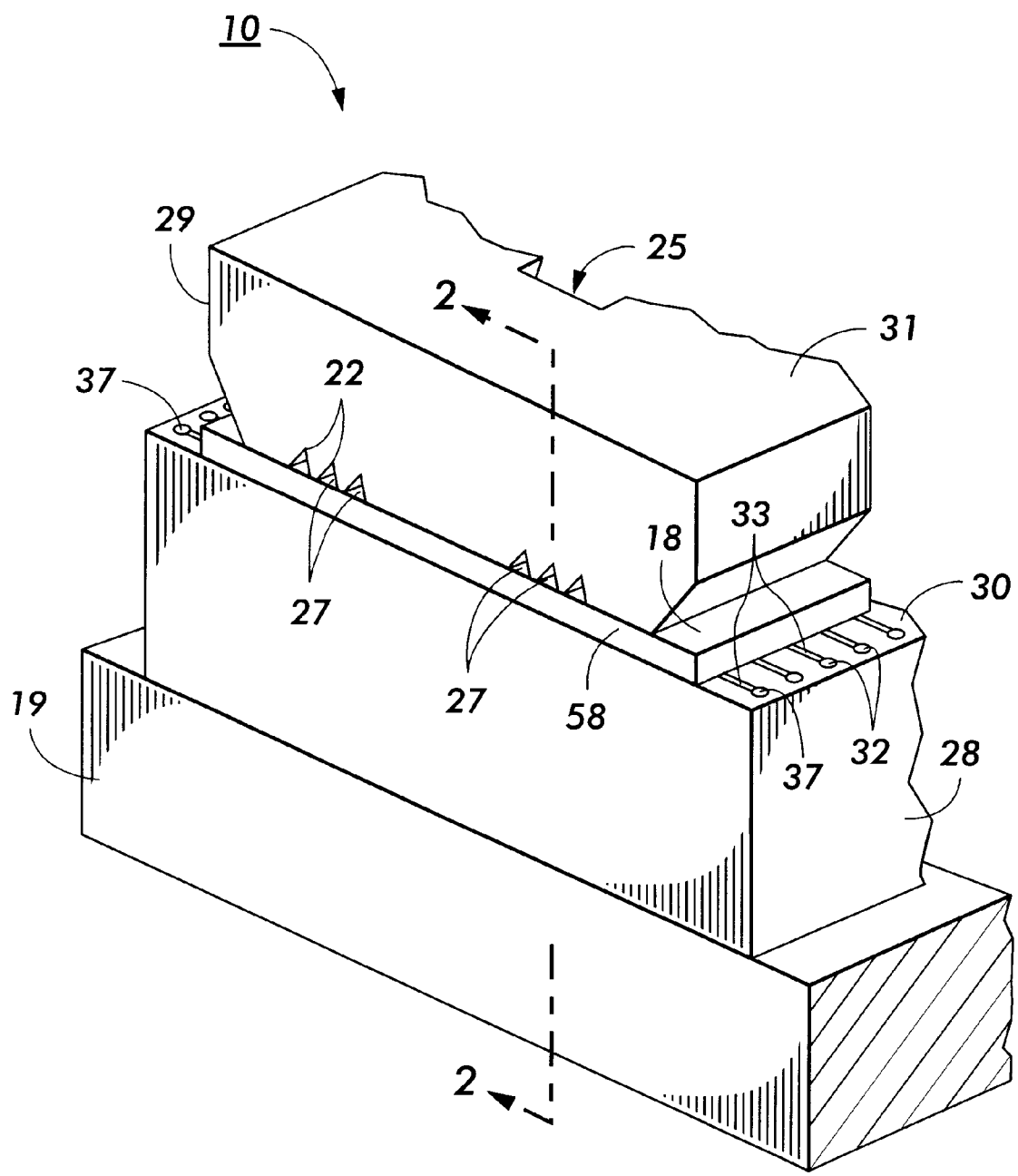
FIG. 1 is an enlarged schematic isometric view of an example of a printhead mounted on a daughter board showing the droplet emitting nozzles.

The present invention is directed to a process for preparing polymers having halomethyl functional groups. The starting polymers for the preparation processes of the present invention are of the following formula:

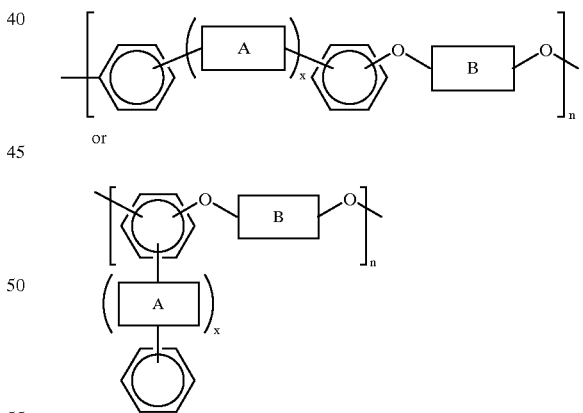

or

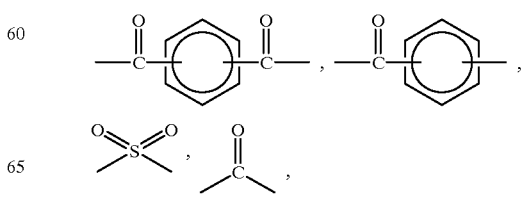

wherein x is an integer of 0 or 1, A is

-continued
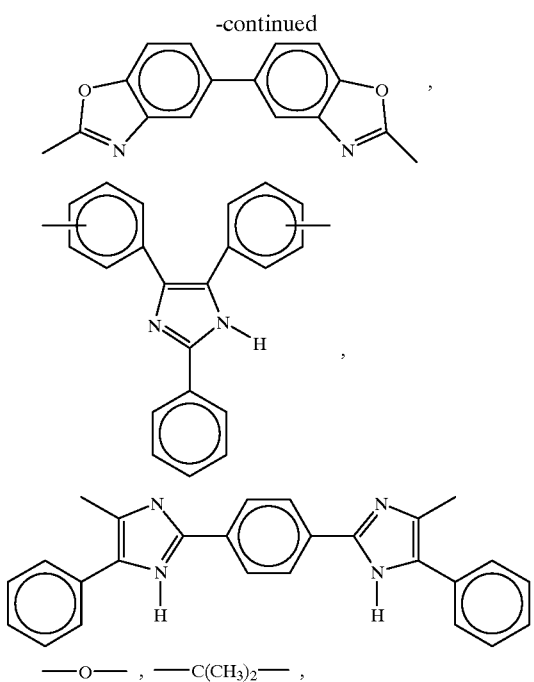
or mixtures thereof, B is
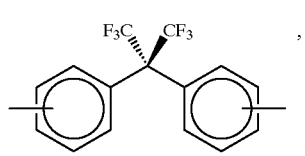
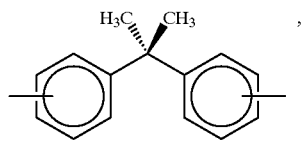
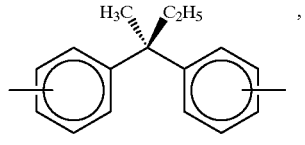
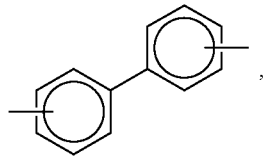
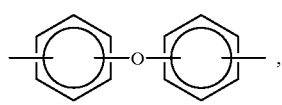
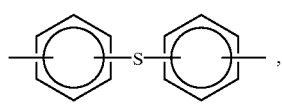
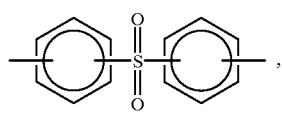
-continued
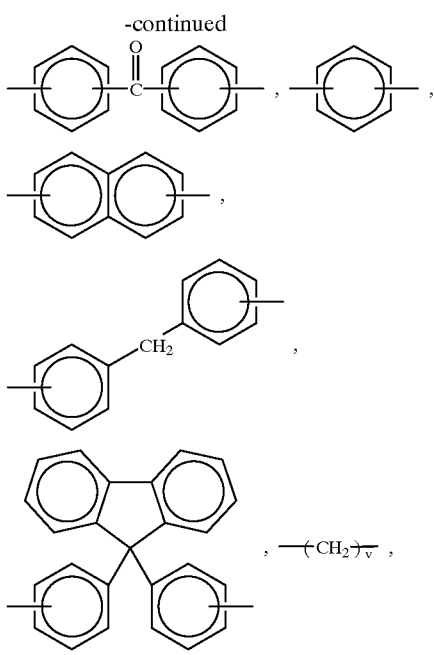
wherein v is an integer of from 1 to about 20, and preferably from 1 to about 10,
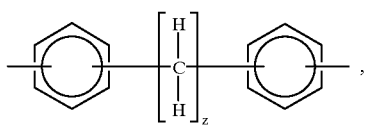
wherein z is an integer of from 2 to about 20, and preferably from 2 to about 10,
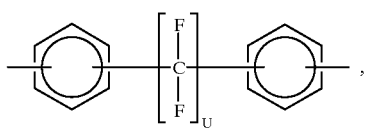
wherein u is an integer of from 1 to about 20, and preferably from 1 to about 10,
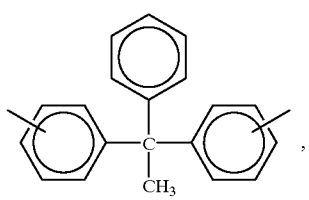
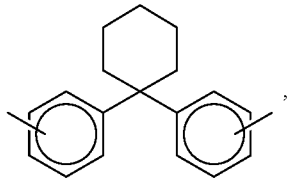

-continued

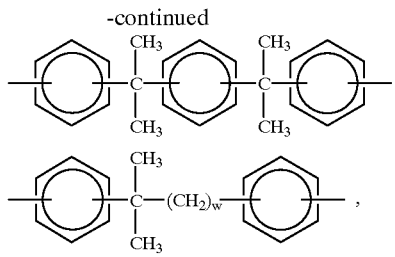

wherein w is an integer of from 1 to about 20, and preferably from 1 to about 10,

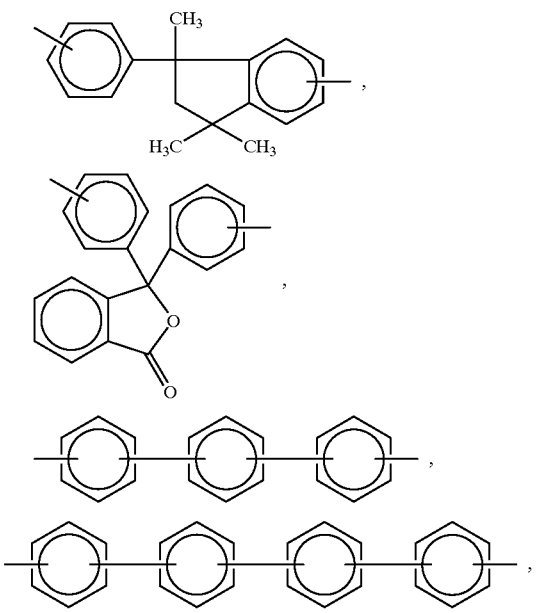

other similar bisphenol derivatives, or mixtures thereof, and n is an integer representing the number of repeating monomer units. The value of n is such that the weight average molecular weight of the material typically is from about 1,000 to about 100,000, preferably from about 1,000 to about 65,000, more preferably from about 1,000 to about 40,000, and even more preferably from about 3,000 to about 25,000, although the weight average molecular weight can be outside these ranges. Preferably, n is an integer of from about 2 to about 70, more preferably from about 5 to about 70, and even more preferably from about 8 to about 50, although the value of n can be outside these ranges. The phenyl groups and the A and/or B groups may also be substituted, although the presence of two or more substituents on the B group ortho to the oxygen groups can render substitution difficult. Substituents can be present on the polymer either prior to or subsequent to the placement of halomethyl functional groups thereon. Substituents can also be placed on the polymer during the process of placement of halomethyl functional groups thereon. Halomethyl groups can also be further reacted to place desired substituents on the polymer. Examples of suitable substituents include (but are not limited to) alkyl groups, including saturated, unsaturated, and cyclic alkyl groups, preferably with from 1 to about 6 carbon atoms, substituted alkyl groups, including saturated, unsaturated, and cyclic substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like wherein two or more substituents can be joined together to form a ring.

Processes for the preparation of these materials are known, and disclosed in, for example, P. M. Hergenrother, *J. Macromol. Sci. Rev. Macromol. Chem.*, C19 (1), 1–34 (1980); P. M. Hergenrother, B. J. Jensen, and S. J. Havens, *Polymer*, 29, 358 (1988); B. J. Jensen and P. M. Hergenrother, "High Performance Polymers," Vol. 1, No. 1) page 31 (1989), "Effect of Molecular Weight on Poly (arylene ether ketone) Properties"; V. Percec and B. C. Auman, *Makromol. Chem.* 185, 2319 (1984); "High Molecular Weight Polymers by Nickel Coupling of Aryl Polychlorides," I. Colon, G. T. Kwaiatkowski, *J. of Polymer Science, Part A, Polymer Chemistry*, 28, 367 (1990); M. Ueda and T. Ito, *Polymer J.*, 23 (4), 297 (1991); "Ethynyl-Terminated Polyarylates: Synthesis and Characterization," S. J. Havens and P. M. Hergenrother, *J. of Polymer Science: Polymer Chemistry Edition*, 22, 3011 (1984); "Ethynyl-Terminated Polysulfones: Synthesis and Characterization," P. M. Hergenrother, *J. of Polymer Science: Polymer Chemistry Edition*, 20, 3131 (1982); K. E. Dukes, M. D. Forbes, A. S. Jeevarajan, A. M. Belu, J. M.DeDimone, R. W. Linton, and V. V. Sheares, *Macromolecules*, 29, 3081 (1996); G. Hougham, G. Tesoro, and J. Shaw, *Polym. Mater. Sci. Eng.*, 61, 369 (1989); V. Percec and B. C. Auman, *Makromol. Chem*, 185, 617 (1984); "Synthesis and characterization of New Fluorescent Poly(arylene ethers)," S. Matsuo, N. Yakoh, S. Chino, M. Mitani, and S. Tagami, *Journal of Polymer Science: Part A: Polymer Chemistry*, 32, 1071 (1994); "Synthesis of a Novel Naphthalene-Based Poly (arylene ether ketone) with High Solubility and Thermal Stability," Mami Ohno, Toshikazu Takata, and Takeshi Endo, *Macromolecules*, 27, 3447 (1994); "Synthesis and Characterization of New Aromatic Poly(ether ketones)," F. W. Mercer, M. T. Mckenzie, G. Merlino, and M. M. Fone, *J. of Applied Polymer Science*, 56, 1397 (1995); H. C. Zhang, T. L. Chen, Y. G. Yuan, Chinese Patent CN 85108751

(1991); "Static and laser light scattering study of novel thermoplastics. 1. Phenolphthalein poly(aryl ether ketone)," C. Wu, S. Bo, M. Siddiq, G. Yang and T. Chen, *Macromolecules,* 29, 2989 (1996); "Synthesis of t-Butyl-Substituted Poly(ether ketone) by Nickel-Catalyzed Coupling Polymerization of Aromatic Dichloride", M. Ueda, Y. Seino, Y. Haneda, M. Yoneda, and J.-I. Sugiyama, *Journal of Polymer Science: Part A: Polymer Chemistry,* 32, 675 (1994); "Reaction Mechanisms: Comb-Like Polymers and Graft Copolymers from Macromers 2. Synthesis, Characterization and Homopolymerization of a Styrene Macromer of Poly(2,6-dimethyl-1,4-phenylene Oxide)," V. Percec, P. L. Rinaldi, and B. C. Auman, *Polymer Bulletin,* 10, 397 (1983); *Handbook of Polymer Synthesis Part A,* Hans R. Kricheldorf, ed., Marcel Dekker, Inc., New York-Basel-Hong Kong (1992); and "Introduction of Carboxyl Groups into Crosslinked Polystyrene," C. R. Harrison, P. Hodge, J. Kemp, and G. M. Perry, *Die Makromolekulare Chemie,* 176, 267 (1975), the disclosures of each of which are totally incorporated herein by reference. Further background on high performance polymers is disclosed in, for example, U.S. Pat. Nos. 2,822,351; 3,065,205; British Patent 1,060,546; British Patent 971,227; British Patent 1,078,234; U.S. Pat. No. 4,175,175; N. Yoda and H. Hiramoto, *J. Macromol. Sci.-Chem.,* A21(13 & 14) pp. 1641 (1984) (Toray Industries, Inc., Otsu, Japan; B. Sillion and L. Verdet, "Polyimides and other High-Temperature polymers", edited by M. J. M. Abadie and B. Sillion, Elsevier Science Publishers B. V. (Amsterdam 1991); "Polyimides with Alicyclic Diamines. II. Hydrogen Abstraction and Photocrosslinking Reactions of Benzophenone Type Polyimides," Q. Jin, T. Yamashita, and K. Horie, *J. of Polymer Science: Part A: Polymer Chemistry,* 32, 503 (1994); Probimide™ 300, product bulletin, Ciba-Geigy Microelectronics Chemicals, "Photosensitive Polyimide System"; *High Performance Polymers and Composites,* J. I. Kroschwitz (ed.), John Wiley & Sons (New York 1991); and T. E. Atwood, D. A. Barr, T. A. King, B. Newton, and B. J. Rose, *Polymer,* 29, 358 (1988), the disclosures of each of which are totally incorporated herein by reference. Further information on radiation curing is disclosed in, for example, *Radiation Curing: Science and Technology,* S. Peter Pappas, ed., Plenum Press (New York 1992), the disclosure of which is totally incorporated herein by reference.

For applications wherein the polymer is to be used as a layer in a thermal ink jet printhead, the polymer preferably has a number average molecular weight of from about 3,000 to about 30,000 Daltons, more preferably from about 10,000 to about 25,000 Daltons, and even more preferably from about 17,000 to about 22,000 Daltons, although the molecular weight can be outside this range.

The halomethylation of the polymer is accomplished by reacting the polymer with a halomethyl alkyl ether and an acetyl halide in the presence of methanol and a halogen-containing Lewis acid catalyst. While not being limited to any particular theory, it is believed that the reaction proceeds as follows, illustrated here for the embodiment wherein the polymer is of the formula

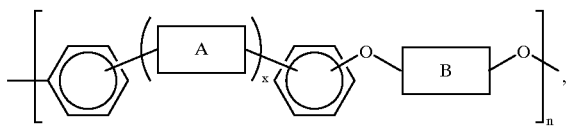

and wherein the halomethyl alkyl ether is a halomethyl ethyl ether:

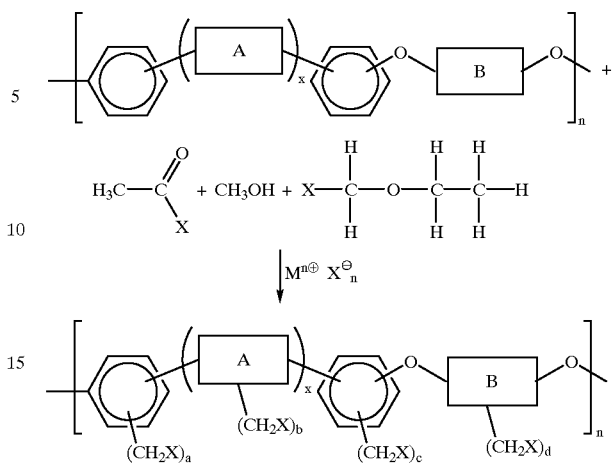

The halomethylation of the polymer is accomplished by reacting the polymer in a chlorinated solvent with a solution of acetyl halide and a halomethyl alkyl ether, wherein the alkyl group, which can be linear, branched, cyclic, saturated, or unsaturated, typically contains from 2 to about 8 carbon atoms, and preferably is an ethyl group, in the presence of a trace amount of methanol and a halogen-containing Lewis acid catalyst, such as those of the general formula $$M^{n\oplus} X_n^{\ominus}$$

wherein n is an integer of 1, 2, 3, 4, or 5, M represents a boron atom or a metal atom, such as tin, aluminum, zinc, antimony, iron (III), gallium, indium, arsenic, mercury, copper, platinum, palladium, or the like, and X represents a halogen atom, such as fluorine, chlorine, bromine, or iodine, with specific examples including $SnCl_4$, $AlCl_3$, $ZnCl_2$, $AlBr_3$, $BF_3$, $SbF_5$, $FeI_3$, $GaBr3$, $InCl_3$, $AsI_5$, $HgBr_2$, CuCl, $PdCl_2$, $PtBr_2$, or the like. More specifically, the room temperature halomethylation reaction proceeds by first adding about 1 part by weight of a halomethyl alkyl ether such as halomethyl ethyl ether, about 4 parts by weight of a chlorinated reaction solvent, such as 1,2 dichloroethane or the like, about 0.15 part by weight of an acetyl halide, and about 0.18 part by weight of a halogen-containing Lewis acid catalyst and a trace amount of methanol (about 0.01 part by weight) under an atmosphere of an inert gas to a reactor. The reagents other than the polymer are stirred, followed by adding thereto a solution containing about 0.52 part by weight of the unsubstituted polymer dissolved in about 3 parts by weight of chlorinated solvent; the polymer solution is slowly added, preferably using a metering pump over a period of about one hour. While not being limited to any particular theory, it is believed that this reaction proceeds via the initial complexation of the metal halide Lewis acid to the oxygen atom of the halomethyl ethyl ether, followed by dissociation of the complex to an anionic metal halide-ethanol species and a halocarbocation that attacks the phenyl rings; in the specific example wherein the "B" group is -φ-C(CH₃)₂-φ-, the halocarbocation typically attacks the phenyl rings at the sterically less hindered sites of the electron rich 4,4'-isopropylidenediphenol (bisphenol-A) fragment. Hydrogen halide, which is generated in-situ from the reaction of trace amounts of methanol with acetyl halide, attacks the metal halide-ethanol species to regenerate the free metal halide Lewis acid and ethanol. The reaction is continued for from about 8 to about 16 hours, depending on the molecular weight of the unsubstituted polymer, until the desired degree of substitution of halomethyl groups per repeat unit is achieved, said degree of substitution preferably being from about 1.4 to about 2.0 halomethyl groups per repeat monomer unit. The reaction is then quenched by the addition of about 0.5 parts by weight of methanol.

The resulting material is of the general formula

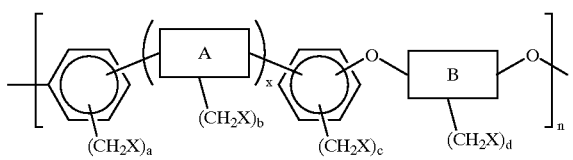

wherein X represents a halogen atom and a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units.

Typical reaction temperatures are from about 10 to about 100° C., preferably from about 10 to about 60° C., more preferably from about 15 to about 40° C., and most preferably from about 20 to about 35° C., although the temperature can be outside these ranges. Typical reaction times are from about 5 to about 30 hours, and preferably from about 5 to about 25 hours, although the time can be outside these ranges. Longer reaction times generally result in higher degrees of halomethylation. When the halomethylated polymer is used as an intermediate material in the synthesis of polymers substituted with photoactive groups, higher degrees of halomethylation generally enable higher degrees of substitution with photoactive groups and thereby enable greater photosensitivity of the polymer. Different degrees of halomethylation may be desirable for different applications. When the material is used as an intermediate in the synthesis of the polymer substituted with photosensitivity-imparting groups, too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of photosensitivity-imparting groups per monomer repeat unit repeat unit) preferably is from about 0.5 to about 1.2, and more preferably from about 0.7 to about 0.8, although the degree of substitution can be outside these ranges for ink jet printhead applications. This amount of substitution corresponds to from about 0.8 to about 1.3 milliequivalents of photosensitivity-imparting groups per gram of resin. When the halomethyl groups are eventually to be substituted by photosensitivity-imparting groups, the degree of halomethylation is typically from about 0.25 to about 2, and, when it is desired to speed up the substitution reaction, preferably is from about 1 to about 2, and even more preferably from about 1.5 to about 2, although the degree of halomethylation can be outside these ranges.

The halomethylated polymer can also be used as a photoresist in its own right provided that a sufficiently high energy source is used to expose the polymer films. Electron beams, ultraviolet lasers, deep ultraviolet sources between 200 and 260 nanometer, and X-rays are generally sufficiently high in energy for the intended purpose of exposing and crosslinking halomethylated polymer films. The mechanism of crosslinking is believed to be the generation of benzylic type radicals which can then couple to render the polymer insoluble.

Halomethylated polymers can also find uses in membrane technology, especially when reacted with tertiary amines to generate cationic sites. For this purpose, the amount of halomethylation typically is from about 1 to about 2 milliequivalents of bound cationic groups per gram of resin.

In some instances, the terminal groups on the polymer can be selected by the stoichiometry of the polymer synthesis. For example, when a polymer is prepared by the reaction of 4,4'-dichlorobenzophenone and bis-phenol A in the presence of potassium carbonate in N,N-dimethylacetamide, if the bis-phenol A is present in about 7.5 to 8 mole percent excess, the resulting polymer generally is bis-phenol A-terminated (wherein the bis-phenol A moiety may or may not have one or more hydroxy groups thereon), and the resulting polymer typically has a polydispersity ($M_w/M_n$) of from about 2 to about 3.5. When the bis-phenol A-terminated polymer is subjected to further reactions to place functional groups thereon, such as halomethyl groups, and/or to convert one kind of functional group, such as a halomethyl group, to another kind of functional group, such as an unsaturated ester group, the polydispersity of the polymer can rise to the range of from about 4 to about 6. In contrast, if the 4,4'-dichlorobenzophenone is present in about 7.5 to 8 mole percent excess, the reaction time is approximately half that required for the bis-phenol A excess reaction, the resulting polymer generally is benzophenone-terminated (wherein the benzophenone moiety may or may not have one or more chlorine atoms thereon), and the resulting polymer typically has a polydispersity of from about 2 to about 3.5. When the benzophenone-terminated polymer is subjected to further reactions to place functional groups thereon, such as halomethyl groups, and/or to convert one kind of functional group, such as a halomethyl group, to another kind of functional group, such as an unsaturated ester group, the polydispersity of the polymer typically remains in the range of from about 2 to about 3.5. Similarly, when a polymer is prepared by the reaction of 4,4'-difluorobenzophenone with either 9,9'-bis (4-hydroxyphenyl)fluorene or bis-phenol A in the presence of potassium carbonate in N,N-dimethylacetamide, if the 4,4'-difluorobenzophenone reactant is present in excess, the resulting polymer generally has benzophenone terminal groups (which may or may not have one or more fluorine atoms thereon). The well-known Carothers equation can be employed to calculate the stoichiometric offset required to obtain the desired molecular weight. (See, for example, William H. Carothers, "An Introduction to the General Theory of Condensation Polymers," *Chem. Rev.*, 8, 353 (1931) and *J. Amer. Chem. Soc.*, 51, 2548 (1929); see also P. J. Flory, *Principles of Polymer Chemistry*, Cornell University Press, Ithaca, New York (1953); the disclosures of each of which are totally incorporated herein by reference.) More generally speaking, during the preparation of polymers of the formula

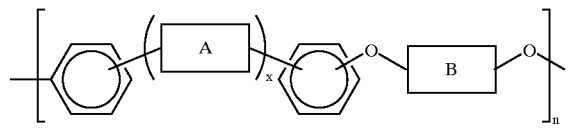

the stoichiometry of the polymer synthesis reaction can be adjusted so that the end groups of the polymer are derived from the "A" groups or derived from the "B" groups.

Specific functional groups can also be present on these terminal "A" groups or "B" groups, such as ethynyl groups or other thermally sensitive groups, hydroxy groups which are attached to the aromatic ring on an "A" or "B" group to form a phenolic moiety, halogen atoms which are attached to the "A" or "B" group, or the like.

Polymers with end groups derived from the "A" group, such as benzophenone groups or halogenated benzophenone groups, may be preferred for some applications because both the syntheses and some of the reactions of these materials to place substituents thereon may be easier to control and may yield better results with respect to, for example, cost, molecular weight, molecular weight range, and polydispersity ($M_w/M_n$) compared to polymers with end groups derived from the "B" group, such as bis-phenol A groups (having one or more hydroxy groups on the aromatic rings thereof) or other phenolic groups. While not being limited to any particular theory, it is believed that the halomethylation reaction in particular proceeds most rapidly on the phenolic tails when the polymer is bis-phenol A terminated. Moreover, it is believed that halomethylated groups on phenolic-terminated polymers may be particularly reactive to subsequent crosslinking or chain extension. In contrast, it is generally believed that halomethylation does not take place on the terminal aromatic groups with electron withdrawing substituents, such as benzophenone, halogenated benzophenone, or the like. The "A" group terminated materials may also function as an adhesive, and in applications such as thermal ink jet printheads, the use of the crosslinked "A" group terminated polymer may reduce or eliminate the need for an epoxy adhesive to bond the heater plate to the channel plate.

The halomethylated polymer can be further reacted to replace at least some of the halomethyl groups with photosensitivity-imparting groups such as unsaturated ester, ether, or alkylcarboxymethylene groups if desired. These substitutions can be carried out as described in, for example: U.S. Pat. No. 5,739,254, filed Aug. 29, 1996, and U.S. Pat. No. 5,753,783, filed Aug. 28, 1997, entitled "Process for Haloalkylation of High Performance Polymers," with the named inventors Timothy J. Fuller, Ram S. Narang, Thomas W. Smith, David J. Luca, and Raymond K. Crandall; U.S. Pat. No. 5,761,809, filed Aug. 29, 1996, entitled "Processes for Substituting Haloalkylated Polymers With Unsaturated Ester, Ether, and Alkylcarboxymethylene Groups," with the named inventors Timothy J. Fuller, Ram S. Narang, Thomas W. Smith, David J. Luca, and Raymond K. Crandall; U.S. Pat. No. 5,863,963, filed Aug. 29, 1996, and Copending application U.S. Ser. No. 09/163,672, filed Sep. 30, 1998, entitled "Halomethylated High Performance Curable Polymers," with the named inventors Ram S. Narang and Timothy J. Fuller; Copending application U.S. Ser. No. 08/705,372, filed Aug. 29, 1996, and Copending application U.S. Ser. No. 09/246,167, filed Feb. 8, 1999, entitled "High Performance Curable Polymers and Processes for the Preparation Thereof," with the named inventors Ram S. Narang and Timothy J. Fuller; Copending application U.S. Ser. No. 08/697,760, filed Aug. 29, 1996, entitled "Aqueous Developable High Performance Curable Aromatic Ether Polymers," and Copending application U.S. Ser. No. 09/247,104, filed Feb. 9, 1999, entitled "Aqueous Developable High Performance Curable Polymers," with the named inventors Ram S. Narang and Timothy J. Fuller; U.S. Pat. No. 5,849,809, filed Aug. 29, 1996, and Copending application U.S. Ser. No. 09/159,426, filed Sep. 23, 1998, entitled "Hydroxyalkylated High Performance Curable Polymers," with the named inventors Ram S. Narang and Timothy J. Fuller; Copending application U.S. Ser. No. 08/705,375, filed Aug. 29, 1996, entitled "Curable Compositions Containing Photosensitive High Performance Aromatic Ether Polymers, and Copending application U.S. Ser. No. 09/221,024, filed Dec. 23, 1998, entitled "Curable Compositions, with the named inventors Timothy J. Fuller, Ram S. Narang, Thomas W. Smith, David J. Luca, and Ralph A. Mosher; Copending application U.S. Ser. No. 08/705,488, filed Aug. 29, 1996, entitled "High Performance Polymer Compositions Having Photosensitivity-Imparting Substituents and Thermal Sensitivity-Imparting Substituents," and Copending application U.S. Ser. No. 09/221,690, filed Dec. 23, 1998, entitled "High Performance Polymer Compositions," with the named inventors Thomas W. Smith, Timothy J. Fuller, Ram S. Narang, and David J. Luca; and Copending application U.S. Ser. No. 08/705,376, filed Aug. 29, 1996, entitled "Blends Containing Photosensitive High Performance Aromatic Ether Curable Polymers," and Copending application U.S. Ser. No. 09/220,273, filed Dec. 23, 1998, entitled "Blends Containing Curable Polymers," with the named inventors Ram S. Narang and Timothy J. Fuller; the disclosures of each of which are totally incorporated herein by reference.

While not required, it may also be advantageous with respect to the ultimate properties of the photopatterned polymer if the polymer is functionalized with a second thermally polymerizable group, typically (although not necessarily) one which reacts at a temperature in excess of the glass transition temperature of the crosslinked or chain extended photopatternable polymer. The second polymerizable group can be either appended to the polymer chain or present as a terminal end group. The thermal sensitivity imparting groups can be present either as terminal end groups on the polymer or as groups which are pendant from one or more monomer repeat units within the polymer chain. When the thermal sensitivity imparting groups are present as terminal end groups, one or both polymer ends can be terminated with the thermal sensitivity imparting group (or more, if the polymer is crosslinked and has more than two termini). Thermally polymerizable groups can be placed on the polymers of the present invention as described in, for example, Copending application U.S. Ser. No. 08/705,488, filed Aug. 29, 1996, entitled "High Performance Polymer Compositions Having Photosensitivity-Imparting Substituents and Thermal Sensitivity-imparting Substituents," and Copending application U.S. Ser. No. 09/221,690, filed Dec. 23, 1998, entitled "High Performance Polymer Compositions," with the named inventors Timothy J. Fuller, David J. Luca, Ram S. Narang, and Thomas W. Smith, "Polyimides," C. E. Sroog, *Prog. Polym. Sci.*, Vol. 16, 561–694 (1991); F. E. Arnold and L. S. Tan, Symposium on *Recent Advances in Polyimides and Other High Performance Polymers*, Reno, Nev. (July 1987); L. S. Tan and F. E. Arnold, *J. Polym. Sci. Part A,* 26, 1819 (1988); U.S. Pat. Nos. 4,973,636; and 4,927,907; the disclosures of each of which are totally incorporated herein by reference. Other procedures for placing thermally curable end groups on aromatic polymers are disclosed in, for example, P. M. Hergenrother, *J. Macromol. Sci. Rev. Macromol. Chem.*, C19 (1), 1–34 (1980); V. Percec and B. C. Auman, *Makromol. Chem.,* 185, 2319 (1984); S. J. Havens, and P. M. Hergenrother, *J. of Polymer Science: Polymer Chemistry Edition,* 22 3011 (1984); P. M. Hergenrother, *J. of Polymer Science: Polymer Chemistry Edition,* 20, 3131 (1982); V. Percec, P. L. Rinaldi, and B. C. Auman, *Polymer Bulletin,* 10, 215 (1983); "Functional Polymers and Sequential Copolymers by Phase Transfer Catalysis, 2. Synthesis and Characterization of Aromatic Poly(ether sulfones Containing Vinylbenzyl and Ethynylbenzyl Chain Ends," V. Percec and B. C. Auman, *Makromol. Chem.* 185, 1867 (1984); "Functional Polymers and Sequential Copolymers by Phase Transfer Catalysis, 6. On the Phase Transfer Catalyzed Williamson Polyetherification as a New Method for the Preparation of Alternating Block copolymers," V. Percec, B. Auman, and P. L. Rinaldi, *Polymer Bulletin,* 10, 391 (1983); "Functional Polymers and Sequential Copolymers by Phase Transfer Catalysis, 3 Synthesis and Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.,* 185, 2319 (1984); and "Phase Transfer Catalysis, Functional Polymers and Sequential Copolymers by PTC,5. Synthesis and Characterization of Polyformals of Polyether Sulfones," *Polymer Bulletin,* 10, 385 (1983); the disclosures of each of which are totally incorporated herein by reference.

Other procedures for placing functional groups on aromatic polymers are disclosed in, for example, W. H. Daly, S. Chotiwana, and R. Nielsen, *Polymer Preprints,* 20(1), 835 (1979); "Functional Polymers and Sequential Copolymers by Phase Transfer Catalysis, 3. Synthesis And Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.,* 185, 2319 (1984); F. Wang and J. Roovers, *Journal of Polymer Science: Part A: Polymer Chemistry,* 32, 2413 (1994); "Details Concerning the Chloromethylation of Soluble High Molecular Weight Polystyrene Using Dimethoxymethane, Thionyl Chloride, And a Lewis Acid: A Full Analysis," M. E. Wright, E. G. Toplikar, and S. A. Svejda, *Macromolecules,* 24, 5879 (1991); "Functional Polymers and Sequential Copolymers by Phase Transfer Catalysts," V. Percec and P. L. Rinaldi, *Polymer Bulletin,* 10, 223 (1983); "Preparation of Polymer Resin and Inorganic Oxide Supported Peroxy-Acids and Their Use in the Oxidation of Tetrahydrothiophene," J. A. Greig, R. D. Hancock, and D. C. Sherrington, *Euopean Polymer J.,* 16, 293 (1980); "Preparation of Poly(vinylbenzyltriphenylphosphonium Perbromide) and Its Application in the Bromination of Organic Compounds," A. Akelah, M. Hassanein, and F. Abdel-Galil, *European Polymer J.,* 20 (3) 221 (1984); J. M. J. Frechet and K. K. Haque, *Macromelcules,* 8, 130 (1975); U.S. Pat. Nos. 3,914,194; 4,110,279; 3,367,914; "Synthesis of Intermediates for Production of Heat Resistant Polymers (Chloromethylation of Diphenyl oxide)," E. P. Tepenitsyna, M. I. Farberov, and A. P. Ivanovski, *Zhurnal Prikladnoi Khimii,* Vol. 40, No. 11, 2540 (1967); U.S. Pat. No. 3,000, 839; Chem Abst. 56, 590f (1962); U.S. Pat. No. 3,128,258; Chem Abstr. 61, 4560a (1964); J. D. Doedens and H. P. Cordts, *Ind. Eng. Ch.,* 83, 59 (1961); British Patent 863,702; and Chem Abstr 55, 18667b (1961); the disclosures of each of which are totally incorporated herein by reference.

Further information regarding photoresist compositions is disclosed in, for example, J. J. Zupancic, D. C. Blazej, T. C. Baker, and E. A. Dinkel, *Polymer Preprints,* 32, (2), 178 (1991); "High Performance Electron Negative Resist, Chloromethylated Polystyrene. A Study on Molecular Parameters," S. Imamura, T. Tamamura, and K. Harada, *J. of Applied Polymer Science,* 27, 937 (1982); "Chloromethylated Polystyrene as a Dry Etching-Resistant Negative Resist for Submicron Technology", S. Imamura, *J. Electrochem. Soc.: Solid-state Science and Technology,* 126(9), 1628 (1979); "UV curing of composites based on modified unsaturated polyesters," W. Shi and B. Ranby, J. of Applied Polymer Science, Vol. 51, 1129 (1994); "Cinnamates VI. Uight-Sensitive Polymers with Pendant o-,m- and p-hydroxycinnamate Moieties," F. Scigalski, M. Toczek, and J. Paczkowski, *Polymer,* 35, 692 (1994); and "Radiation-cured Polyurethane Methacrylate Pressure-sensitive Adhesives," G. Ansell and C. Butler, *Polymer,* 35 (9), 2001 (1994), the disclosures of each of which are totally incorporated herein by reference.

If desired, to reduce the amount of residual halogen in a photoresist or other composition (containing polymers prepared by the process of the present invention wherein the halomethyl groups are subsequently replaced with photosensitivity-imparting substituents), thereby also reducing or eliminating the generation of hydrohalic acid during a subsequent thermal curing step, any residual halogen atoms or halomethyl groups on the photopatternable polymer can be converted to methoxy groups, hydroxide groups, acetoxy groups, amine groups, or the like by any desired process, including those processes disclosed hereinabove, those disclosed in, for example, British Patent 863,702, *Chem Abstr.* 55, 18667b (1961), and other publications previously incorporated herein by reference, and the like.

The photopatternable polymer can be cured by uniform exposure to actinic radiation at wavelengths and/or energy levels capable of causing crosslinking or chain extension of the polymer through the photosensitivity-imparting groups. Alternatively, the photopatternable polymer is developed by imagewise exposure of the material to radiation at a wavelength and/or at an energy level to which the photosensitivity-imparting groups are sensitive. Typically, a photoresist composition will contain the photopatternable polymer, an optional solvent for the photopatternable polymer, an optional sensitizer, and an optional photoinitiator. Solvents may be particularly desirable when the uncrosslinked photopatternable polymer has a high Tg. The solvent and photopatternable polymer typically are present in relative amounts of from 0 to about 99 percent by weight solvent and from about 1 to 100 percent polymer, preferably are present in relative amounts of from about 20 to about 60 percent by weight solvent and from about 40 to about 80 percent by weight polymer, and more preferably are present in relative amounts of from about 30 to about 60 percent by weight solvent and from about 40 to about 70 percent by weight polymer, although the relative amounts can be outside these ranges.

The halomethylated polymers prepared by the process of the present invention are generally patternable with electron beam, ultraviolet, or x-ray radiation. Typical suitable wavelengths for ultraviolet radiation are from about 200 to about 365 nanometer, and preferably deep uv radiation of from about 200 to about 260 nanometer, although the wavelength can be outside this range. Typical suitable energy levels for e-beam radiation are from about 600 to about 2,000 megarads, and preferably about 1,000 megarads, although the energy level can be outside this range. Typical suitable x-ray radiation levels are from about 100 to about 2,500 millijoules per square centimeter, or from about 600 to about 2,000 rads, although the radiation level can be outside this range. Suitable imaging apparatus for e-beam exposure includes Van de Graaf generators and other high energy particle accelerators, such as those available from Energy Science, Woburn Mass., Radionics, Woburn, Mass., scanning electron microscope equipment, such as that available from Siemens AG, and the like. Other suitable e-beam sources include 20 KV exposures using a $LaB_6$ electron gun at 0.24 megarads per hour, and an RCA Transmission Electron Microscope Model 3G modified to provide a source between 22 and 44 KeV electrons. Suitable imaging apparatus for ultraviolet exposure includes equipment available from Adcotech Corp., Advance Process Supply Co., Argus International, Arthur Blank & Co., Inc., Chemcut Corp., Chemical Etching Equipment & Supply Co., The Christopher Group, Cirplex/Quality Assurance Marketing Div., Colight, Inc., DGE, Inc., Dyna/Pert, Div. of Emhart Corp., Dyonics Inc., Industrial Div., Fusion Systems Corp., Gyrex Corp., subsidiary of Allied Chemical Co., Hybrid Technology Group, Inc., International Printing Machines Corp., Geo. Koch & Sons, Ashdee Div., Kras Corp., Machine Technology, Inc., Magnum Technology Inc., Nationwide Circuit Products, Stenning Instruments Inc., UV Process Supply, Inc., Uvexs, Inc., UVP, Inc., Ultraviolet Products, Xenon Corp., and the like. Any source of x-ray radiation can be used for x-ray imaging apparatus. Further information regarding suitable exposure apparatus is disclosed in, for example, *Reactive Cure Systems: UV-IR-EB*, CAPTAN Associates Inc., PO Box 504, Brick, N.J. (1994), and in "Fundamental Aspects of Electron Beam Lithography," G. M. Venkatesh et al., *Polymer Preprints,* 22(2), 335 (1981), the disclosures of each of which are totally incorporated herein by reference.

While not being limited to any particular theory, it is believed that exposure to, for example, e-beam, ultraviolet, or x-ray radiation generally results in free radical cleavage of the halogen atom from the methyl group to form a benzyl radical. Crosslinking or chain extension then occurs at the "long" bond sites as illustrated below for the chloromethylated material:

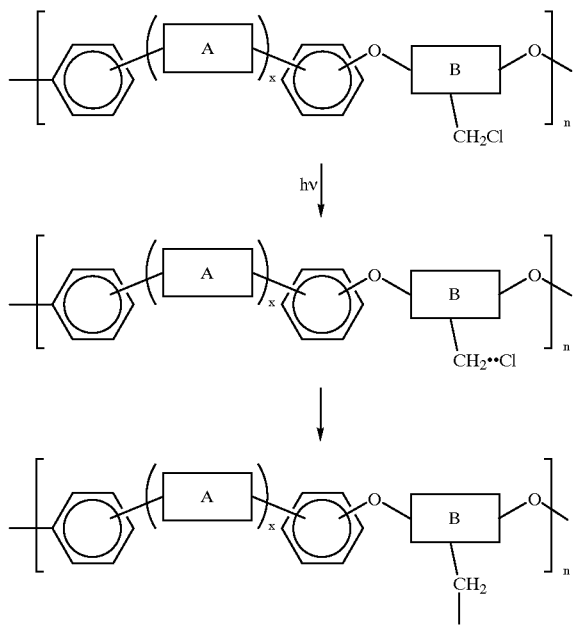

In all of the above reactions and substitutions illustrated above for the polymer of the formula

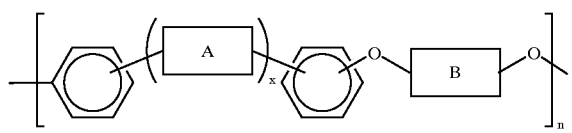

it is to be understood that analogous reactions and substitutions will occur for the polymer of the formula

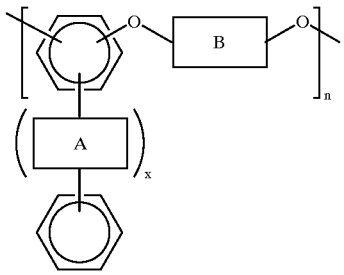

Photopatternable halomethylated polymers of the present invention can be used as components in ink jet printheads. The printheads of the present invention can be of any suitable configuration. An example of a suitable configuration, suitable in this instance for thermal ink jet printing, is illustrated schematically in FIG. 1, which depicts an enlarged, schematic isometric view of the front face 29 of a printhead 10 showing the array of droplet emitting nozzles 27. Referring also to FIG. 2, discussed later, the lower electrically insulating substrate or heating element plate 28 has the heating elements 34 and addressing electrodes 33 patterned on surface 30 thereof, while the upper substrate or channel plate 31 has parallel grooves 20 which extend in one direction and penetrate through the upper substrate front face edge 29. The other end of grooves 20 terminate at slanted wall 21, the floor 41 of the internal recess 24 which is used as the ink supply manifold for the capillary filled ink channels 20, has an opening 25 therethrough for use as an ink fill hole. The surface of the channel plate with the grooves are aligned and bonded to the heater plate 28, so that a respective one of the plurality of heating elements 34 is positioned in each channel, formed by the grooves and the lower substrate or heater plate. Ink enters the manifold formed by the recess 24 and the lower substrate 28 through the fill hole 25 and by capillary action, fills the channels 20 by flowing through an elongated recess 38 formed in the thick film insulative layer 18. The ink at each nozzle forms a meniscus, the surface tension of which prevents the ink from weeping therefrom. The addressing electrodes 33 on the lower substrate or channel plate 28 terminate at terminals 32. The upper substrate or channel plate 31 is smaller than that of the lower substrate in order that the electrode terminals 32 are exposed and available for wire bonding to the electrodes on the daughter board 19, on which the printhead 10 is permanently mounted. Layer 18 is a thick film passivation layer, discussed later, sandwiched between the upper and lower substrates. This layer is etched to expose the heating elements, thus placing them in a pit, and is etched to form the elongated recess to enable ink flow between the manifold 24 and the ink channels 20. In addition, the thick film insulative layer is etched to expose the electrode terminals.

Figure 2:
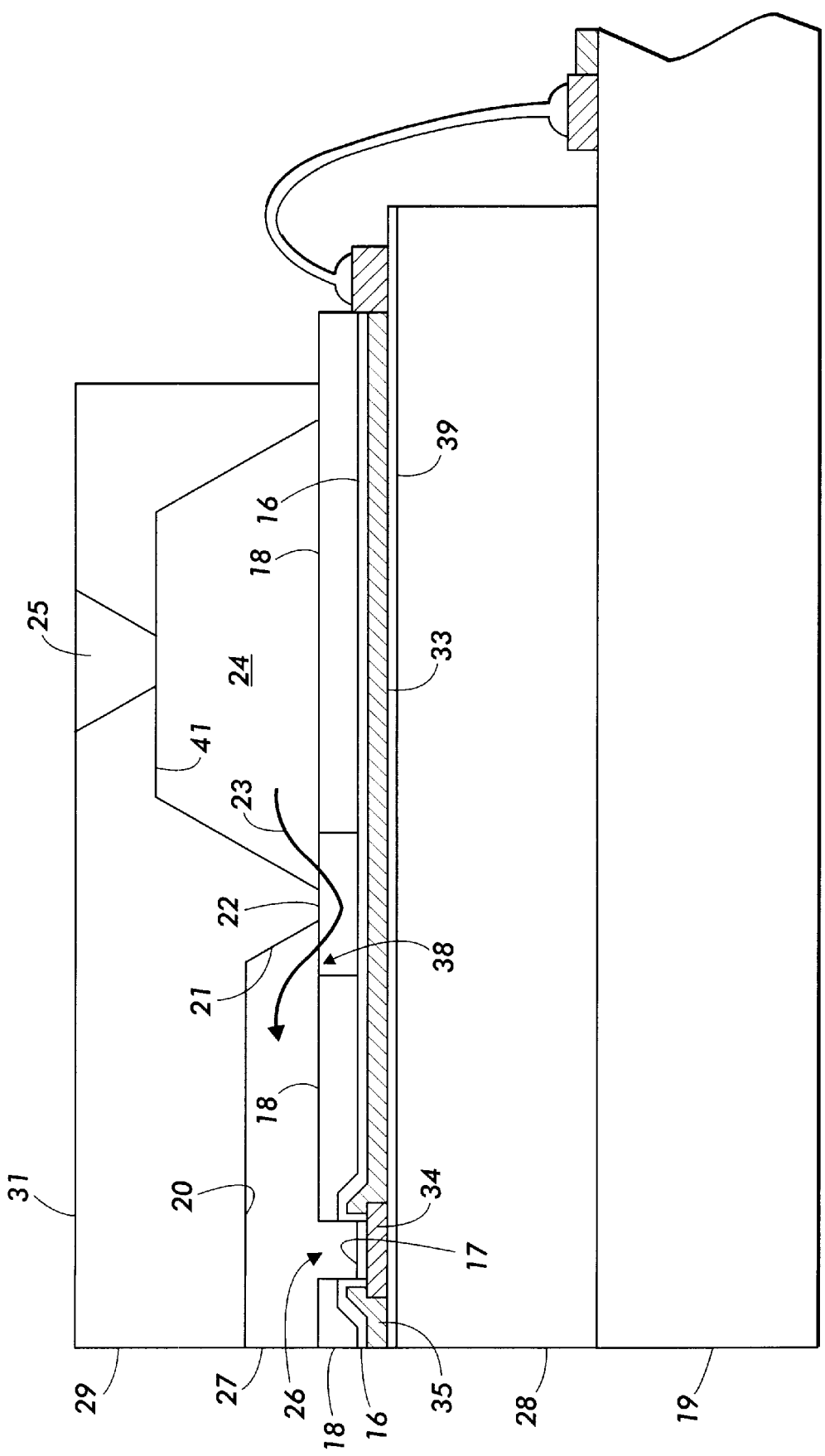
FIG. 2 is an enlarged cross-sectional view of FIG. 1 as viewed along the line 2—2 thereof and showing the electrode passivation and ink flow path between the manifold and the ink channels.

A cross sectional view of FIG. 1 is taken along view line 2—2 through one channel and shown as FIG. 2 to show how the ink flows from the manifold 24 and around the end 21 of the groove 20 as depicted by arrow 23. As is disclosed in U.S. Pat. Nos. 4,638,337, 4,601,777, and U.S. Pat. No. Re. 32,572, the disclosures of each of which are totally incorporated herein by reference, a plurality of sets of bubble generating heating elements 34 and their addressing electrodes 33 can be patterned on the polished surface of a single side polished (100) silicon wafer. Prior to patterning, the multiple sets of printhead electrodes 33, the resistive material that serves as the heating elements 34, and the common return 35, the polished surface of the wafer is coated with an underglaze layer 39 such as silicon dioxide, having a typical thickness of from about 5,000 Angstroms to about 2 microns, although the thickness can be outside this range. The resistive material can be a doped polycrystalline silicon, which can be deposited by chemical vapor deposition (CVD) or any other well known resistive material such as zirconium boride ($ZrB_2$). The common return and the addressing electrodes are typically aluminum leads deposited on the underglaze and over the edges of the heating elements. The common return ends or terminals 37 and addressing electrode terminals 32 are positioned at predetermined locations to allow clearance for wire bonding to the electrodes (not shown) of the daughter board 19, after the channel plate 31 is attached to make a printhead. The common return 35 and the addressing electrodes 33 are deposited to a thickness typically of from about 0.5 to about 3 microns, although the thickness can be outside this range, with the preferred thickness being 1.5 microns.

If polysilicon heating elements are used, they may be subsequently oxidized in steam or oxygen at a relatively high temperature, typically about 1,100° C. although the temperature can be above or below this value, for a period of time typically of from about 50 to about 80 minutes, although the time period can be outside this range, prior to the deposition of the aluminum leads, in order to convert a small portion of the polysilicon to $SiO_2$. In such cases, the heating elements are thermally oxidized to achieve an overglaze (not shown) of $SiO_2$ with a thickness typically of from about 500 Angstroms to about 1 micron, although the thickness can be outside this range, which has good integrity with substantially no pinholes.

In one embodiment, polysilicon heating elements are used and an optional silicon dioxide thermal oxide layer 17 is grown from the polysilicon in high temperature steam. The thermal oxide layer is typically grown to a thickness of from about 0.5 to about 1 micron, although the thickness can be outside this range, to protect and insulate the heating elements from the conductive ink. The thermal oxide is removed at the edges of the polysilicon heating elements for attachment of the addressing electrodes and common return, which are then patterned and deposited. If a resistive material such as zirconium boride is used for the heating elements, then other suitable well known insulative materials can be used for the protective layer thereover. Before electrode passivation, a tantalum (Ta) layer (not shown) can be optionally deposited, typically to a thickness of about 1 micron, although the thickness can be above or below this value, on the heating element protective layer 17 for added protection thereof against the cavitational forces generated by the collapsing ink vapor bubbles during printhead operation. The tantalum layer is etched off all but the protective layer 17 directly over the heating elements using, for example, $CF_4/O_2$ plasma etching. For polysilicon heating elements, the aluminum common return and addressing electrodes typically are deposited on the underglaze layer and over the opposing edges of the polysilicon heating elements which have been cleared of oxide for the attachment of the common return and electrodes.

For electrode passivation, a film 16 is deposited over the entire wafer surface, including the plurality of sets of heating elements and addressing electrodes. The passivation film 16 provides an ion barrier which will protect the exposed electrodes from the ink. Examples of suitable ion barrier materials for passivation film 16 include polyimide, plasma nitride, phosphorous doped silicon dioxide, materials disclosed herein as being suitable for insulative layer 18, and the like, as well as any combinations thereof. An effective ion barrier layer is generally achieved when its thickness is from about 1000 Angstroms to about 10 microns, although the thickness can be outside this range. In 300 dpi printheads, passivation layer 16 preferably has a thickness of about 3 microns, although the thickness can be above or below this value. In 600 dpi printheads, the thickness of passivation layer 16 preferably is such that the combined thickness of layer 16 and layer 18 is about 25 microns, although the thickness can be above or below this value. The passivation film or layer 16 is etched off of the terminal ends of the common return and addressing electrodes for wire bonding later with the daughter board electrodes. This etching of the silicon dioxide film can be by either the wet or dry etching method. Alternatively, the electrode passivation can be by plasma deposited silicon nitride ($Si_3N_4$).

Next, a thick film type insulative layer 18, of a polymeric material prepared by the process disclosed herein (either having halomethyl substituents, in which instance photoexposure is carried out by exposure to electron beam radiation, x-ray radiation, or deep ultraviolet radiation, or having its halomethyl substituents partially or completely replaced with photosensitivity-imparting substituents), is formed on the passivation layer 16, typically having a thickness of from about 10 to about 100 microns and preferably in the range of from about 25 to about 50 microns, although the thickness can be outside these ranges. Even more preferably, in 300 dpi printheads, layer 18 preferably has a thickness of about 30 microns, and in 600 dpi printheads, layer 18 preferably has a thickness of from about 20 to about 22 microns, although other thicknesses can be employed. The insulative layer 18 is photolithographically processed to enable etching and removal of those portions of the layer 18 over each heating element (forming recesses 26), the elongated recess 38 for providing ink passage from the manifold 24 to the ink channels 20, and over each electrode terminal 32, 37. The elongated recess 38 is formed by the removal of this portion of the thick film layer 18. Thus, the passivation layer 16 alone protects the electrodes 33 from exposure to the ink in this elongated recess 38. Optionally, if desired, insulative layer 18 can be applied as a series of thin layers of either similar or different composition. Typically, a thin layer is deposited, photoexposed, partially cured, followed by deposition of the next thin layer, photoexposure, partial curing, and the like. The thin layers constituting thick film insulative layer 18 contain a polymer of the formula indicated hereinabove. In one embodiment of the present invention, a first thin layer is applied to contact layer 16, said first thin layer containing a mixture of a polymer of the formula indicated hereinabove and an epoxy polymer, followed by photoexposure, partial curing, and subsequent application of one or more successive thin layers containing a polymer of the formula indicated hereinabove.

Figure 3:
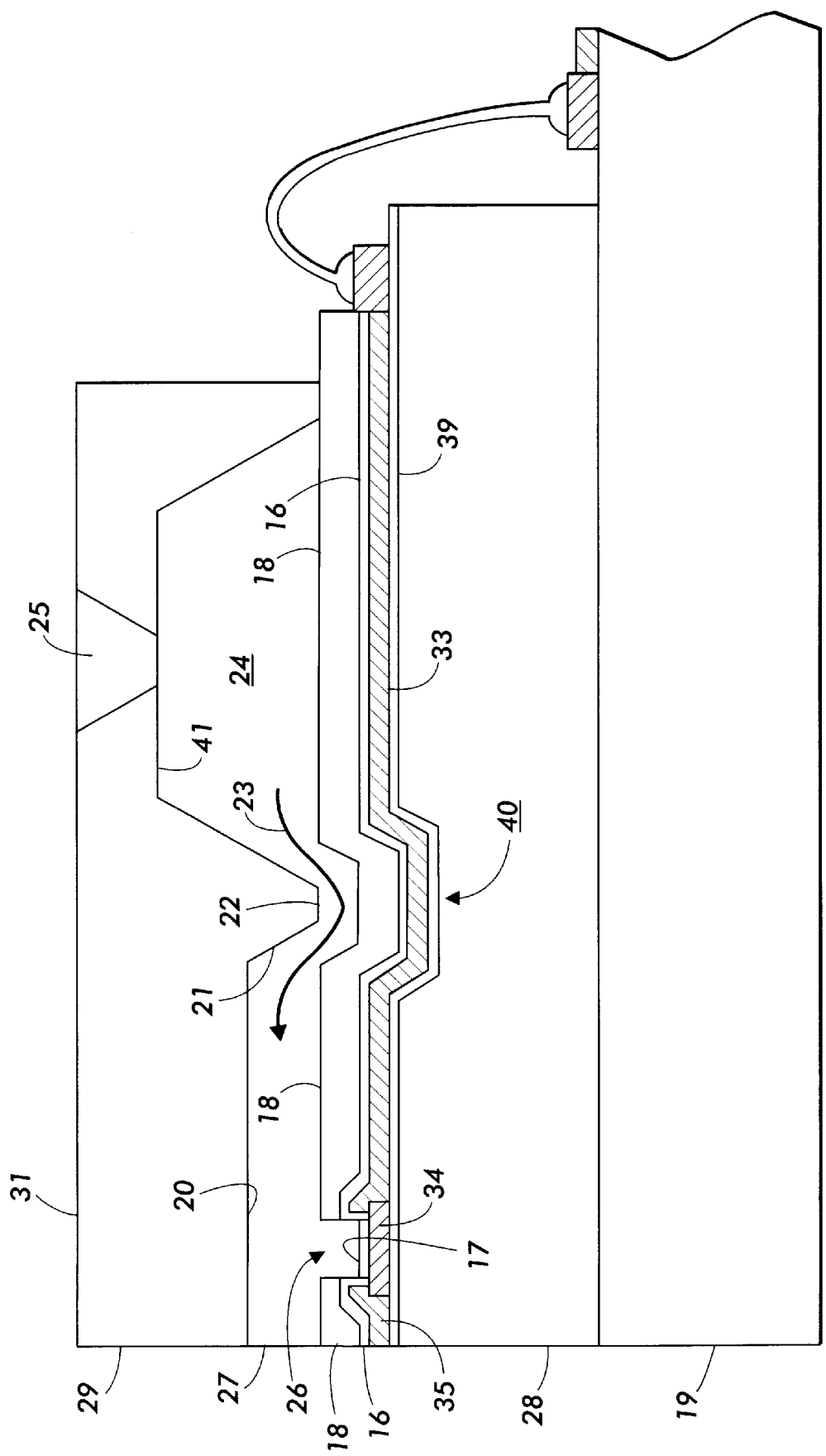
FIG. 3 is an enlarged cross-sectional view of an alternate embodiment of the printhead in FIG. 1 as viewed along the line 2—2 thereof.

FIG. 3 is a similar view to that of FIG. 2 with a shallow anisotropically etched groove 40 in the heater plate, which is silicon, prior to formation of the underglaze 39 and patterning of the heating elements 34, electrodes 33 and common return 35. This recess 40 permits the use of only the thick film insulative layer 18 and eliminates the need for the usual electrode passivating layer 16. Since the thick film layer 18 is impervious to water and relatively thick (typically from about 20 to about 40 microns, although the thickness can be outside this range), contamination introduced into the circuitry will be much less than with only the relatively thin passivation layer 16 well known in the art. The heater plate is a fairly hostile environment for integrated circuits. Commercial ink generally entails a low attention to purity. As a result, the active part of the heater plate will be at elevated temperature adjacent to a contaminated aqueous ink solution which undoubtedly abounds with mobile ions. In addition, it is generally desirable to run the heater plate at a voltage of from about 30 to about 50 volts, so that there will be a substantial field present. Thus, the thick film insulative layer 18 provides improved protection for the active devices and provides improved protection, resulting in longer operating lifetime for the heater plate.

When a plurality of lower substrates 28 are produced from a single silicon wafer, at a convenient point after the underglaze is deposited, at least two alignment markings (not shown) preferably are photolithographically produced at predetermined locations on the lower substrates 28 which make up the silicon wafer. These alignment markings are used for alignment of the plurality of upper substrates 31 containing the ink channels. The surface of the single sided wafer containing the plurality of sets of heating elements is bonded to the surface of the wafer containing the plurality of ink channel containing upper substrates subsequent to alignment.

As disclosed in U.S. Pat. Nos. 4,601,777 and 4,638,337, the disclosures of each of which are totally incorporated herein by reference, the channel plate is formed from a two side polished, (100) silicon wafer to produce a plurality of upper substrates 31 for the printhead. After the wafer is chemically cleaned, a pyrolytic CVD silicon nitride layer (not shown) is deposited on both sides. Using conventional photolithography, a via for fill hole 25 for each of the plurality of channel plates 31 and at least two vias for alignment openings (not shown) at predetermined locations are printed on one wafer side. The silicon nitride is plasma etched off of the patterned vias representing the fill holes and alignment openings. A potassium hydroxide (KOH) anisotropic etch can be used to etch the fill holes and alignment openings. In this case, the [111] planes of the (100) wafer typically make an angle of about 54.7 degrees with the surface of the wafer. The fill holes are small square surface patterns, generally of about 20 mils (500 microns) per side, although the dimensions can be above or below this value, and the alignment openings are from about 60 to about 80 mils (1.5 to 3 millimeters) square, although the dimensions can be outside this range. Thus, the alignment openings are etched entirely through the 20 mil (0.5 millimeter) thick wafer, while the fill holes are etched to a terminating apex at about halfway through to three-quarters through the wafer. The relatively small square fill hole is invariant to further size increase with continued etching so that the etching of the alignment openings and fill holes are not significantly time constrained.

Next, the opposite side of the wafer is photolithographically patterned, using the previously etched alignment holes as a reference to form the relatively large rectangular recesses 24 and sets of elongated, parallel channel recesses that will eventually become the ink manifolds and channels of the printheads. The surface 22 of the wafer containing the manifold and channel recesses are portions of the original wafer surface (covered by a silicon nitride layer) on which an adhesive, such as a thermosetting epoxy, will be applied later for bonding it to the substrate containing the plurality of sets of heating elements. The adhesive is applied in a manner such that it does not run or spread into the grooves or other recesses. The alignment markings can be used with, for example, a vacuum chuck mask aligner to align the channel wafer on the heating element and addressing electrode wafer. The two wafers are accurately mated and can be tacked together by partial curing of the adhesive.

Alternatively, the heating element and channel wafers can be given precisely diced edges and then manually or automatically aligned in a precision jig. Alignment can also be performed with an infrared aligner-bonder, with an infrared microscope using infrared opaque markings on each wafer to be aligned, or the like. The two wafers can then be cured in an oven or laminator to bond them together permanently. The channel wafer can then be milled to produce individual upper substrates. A final dicing cut, which produces end face 29, opens one end of the elongated groove 20 producing nozzles 27. The other ends of the channel groove 20 remain closed by end 21. However, the alignment and bonding of the channel plate to the heater plate places the ends 21 of channels 20 directly over elongated recess 38 in the thick film insulative layer 18 as shown in FIG. 2 or directly above the recess 40 as shown in FIG. 3 enabling the flow of ink into the channels from the manifold as depicted by arrows 23. The plurality of individual printheads produced by the final dicing are bonded to the daughter board and the printhead electrode terminals are wire bonded to the daughter board electrodes.

In one embodiment, a heater wafer with a phosphosilicate glass layer is spin coated with a solution of Z6020 adhesion promoter (0.01 weight percent in 95 parts methanol and 5 parts water, Dow Corning) at 3000 revolutions per minute for 10 seconds and dried at 100° C. for between 2 and 10 minutes. The wafer is then allowed to cool at 25° C. for 5 minutes before spin coating the photoresist containing the halomethyl-substituted polymer onto the wafer at between 1,000 and 3,000 revolutions per minute for between 30 and 60 seconds. The photoresist solution is made by dissolving polyarylene ether ketone with 1.5 halomethyl groups per repeat unit and a weight average molecular weight of 8,000 in N-methylpyrrolidinone at 40 weight percent solids with Michler's ketone (1.2 parts ketone per every 10 parts of 40 weight percent solids polymer solution). The film is heated (soft baked) in an oven for between 10 and 15 minutes at 70° C. After cooling to 25° C. over 5 minutes, the film is covered with a mask and exposed to electron beam radiation, x-ray radiation, or deep UV radiation, such as a KrF deep UV CW lamp with output at 22 to 26 millijoules per square centimeter at 253.7 nanometer. The exposed wafer is then heated at 70° C. for 2 minutes post exposure bake, followed by cooling to 25° C. over 5 minutes. The film is developed with a developer mixture containing 60 percent by volume cyclohexanone and 40 percent by volume chloroform, washed with hexane, and then dried at 70° C. for 2 minutes. A second developer/wash cycle is carried out if necessary to obtain a wafer with clean features. The processed wafer is transferred to an oven at 25° C., and the oven temperature is raised from 25 to 90° C. at 2° C. per minute. The temperature is maintained at 90° C. for 2 hours, and then increased to 260° C. at 2° C. per minute. The oven temperature is maintained at 260° C. for 2 hours and then the oven is turned off and the temperature is allowed to cool gradually to 25° C. When thermal cure of the photoresist films is carried out under inert atmosphere, such as nitrogen or one of the noble gases, such as argon, neon, krypton, xenon, or the like, there is markedly reduced oxidation of the developed film and improved thermal and hydrolytic stability of the resultant devices. Moreover, adhesion of developed photoresist film is improved to the underlying substrate. If a second layer is spin coated over the first layer, the heat cure of the first developed layer can be stopped between 80 and 260° C. before the second layer is spin coated onto the first layer. A second thicker layer is deposited by repeating the above procedure a second time. This process is intended to be a guide in that procedures can be outside the specified conditions depending on film thickness and photoresist molecular weight. Films at 30 microns have been developed with clean features at 600 dots per inch.

The halomethylated polymer insulative layer, because of its relatively low polarity, is highly resistant to attack from inks commonly used in thermal ink jet printing processes, including inks of relatively high pH values of from about 8.5 to about 10.

In other embodiments of the present invention, elements of the printhead other than layer 18 are fabricated from the polymers prepared according to the process of the present invention. For example, as disclosed in Copending application U.S. Ser. No. 09/120,746, filed Jul. 23, 1998, entitled "Improved Thermal Ink Jet Printhead and Process for the Preparation Thereof," with the named inventors Ram S. Narang, Gary A. Kneezel, Bidan Zhang, Almon P. Fisher, and Timothy J. Fuller, the disclosure of which is totally incorporated herein by reference, upper substrate or channel plate 31 and/or the adhesive situated between layer 18 and upper substrate or channel plate 31 either instead of or in addition to layer 18 can be fabricated from the polymers prepared according to the process of the present invention. When layer 18, channel plate 31, and an optional adhesive situated between layer 18 and channel plate 31 are all fabricated from the polymers prepared according to the process of the present invention, the printhead is substantially free of an interface between the lower substrate and the upper substrate.

The printhead illustrated in FIGS. 1 through 3 constitutes a specific embodiment of the present invention. Any other suitable printhead configuration comprising ink-bearing channels terminating in nozzles on the printhead surface can also be employed with the materials disclosed herein to form a printhead of the present invention.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

A polyarylene ether ketone of the formula

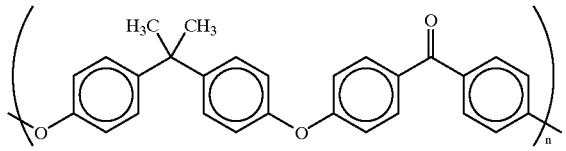

wherein n is between about 6 and about 30 (hereinafter referred to as poly(4-CPK-BPA)) was prepared as follows. A 5 gallon Parr Reactor equipped with a 500 milliliter Dean-Stark (Barrett) trap, condenser, mechanical stirrer, argon inlet, and stopper was assembled. 4,4'-Dichlorobenzophenone (Aldrich 11,370, Aldrich Chemical Co., Milwaukee, Wis., 1,000 grams), bis-phenol A (Aldrich 23,965-8, 782 grams), potassium carbonate (1,313 grams), anhydrous N,N-dimethylacetamide (5,600 milliliters), and toluene (630 milliliters) were added to the reactor, followed by heating the reactor to 165° C. while the volatile toluene component was collected and removed. After 12 hours, the reactor was cooled and 200 more grams of bis-phenol A (Aldrich 23,965-8) and toluene (500 milliliters) were added to the reactor, followed by heating the reactor to 165° C. while the volatile toluene component was collected and removed. After 24 hours of heating at 165° C. with continuous stirring, an aliquot of the reaction product that had been precipitated into methanol was analyzed by gel permeation chromatography (gpc) (elution solvent was tetrahydrofuran) with the following results: $M_n$=2,800, $M_w$=4,600 Daltons. After 45 hours at 165° C. with continuous stirring, the reaction mixture was filtered to remove potassium carbonate, diluted with 4 liters of tetrahydrofuran, and precipitated into methanol/water (40 gallons/20 gallons). The polymer (poly(4-CPK-BPA)) was isolated in 85 percent yield after filtration and drying in vacuo. GPC analysis was as follows: $M_n$=9,700 $M_w$=19,680 Daltons. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from bis-phenol A.

EXAMPLE II

A polyarylene ether ketone of the formula

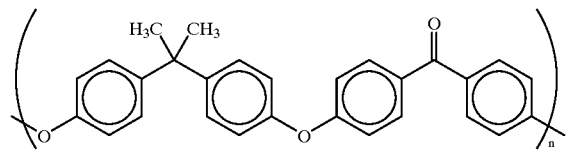

wherein n is between about 6 and about 30 (hereinafter referred to as poly(4-CPK-BPA)) was prepared as follows. A 5 gallon Parr Reactor equipped with a 500 milliliter Dean-Stark (Barrett) trap, condenser, mechanical stirrer, argon inlet, and stopper was assembled. 4,4'-Dichlorobenzophenone (Aldrich 11,370, Aldrich Chemical Co., Milwaukee, Wis., 1,000 grams), bis-phenol A (Aldrich 23,965-8, 782 grams), potassium carbonate (1,313 grams), anhydrous N,N-dimethylacetamide (5,600 milliliters), and toluene (630 milliliters) were added to the reactor, followed by heating the reactor to 165° C. while the volatile toluene component was collected and removed. After 12 hours, the reactor was cooled and 200 more grams of bis-phenol A (Aldrich 23,965-8) and toluene (500 milliliters) were added to the reactor, which was then heated to 165° C. while the volatile toluene component was collected and removed. After 24 hours of heating at 165° C. with continuous stirring, an aliquot of the reaction product that had been precipitated into methanol was analyzed by gel permeation chromatography (gpc) (elution solvent was tetrahydrofuran) with the following results: $M_n$=2,500, $M_w$=4,800 Daltons. After 45 hours at 165° C. with continuous stirring, the reaction mixture was filtered to remove potassium carbonate, diluted with 4 liters of tetrahydrofuran, and precipitated into methanol/water (40 gallons/20 gallons). The polymer (poly (4-CPK-BPA)) was isolated in 85 percent yield after filtration and drying in vacuo. GPC analysis was as follows: $M_n$=6800, $M_w$=11260 Daltons. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from bis-phenol A.

EXAMPLE III

A polyarylene ether ketone of the formula

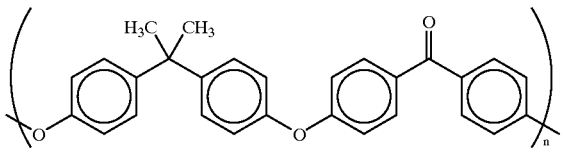

wherein n is between about 6 and about 30 (hereinafter referred to as poly(4-CPK-BPA)) was prepared as follows. A 5 gallon Parr Reactor equipped with a 500 milliliter Dean-Stark (Barrett) trap, condenser, mechanical stirrer, argon inlet, and stopper was assembled. 4,4'-Dichlorobenzophenone (Aldrich 11,370, Aldrich Chemical Co., Milwaukee, Wis., 800 grams), bis-phenol A (Aldrich 23,965-8, 982 grams), potassium carbonate (1,313 grams), anhydrous N,N-dimethylacetamide (5,600 milliliters), and toluene (630 milliliters) were added to the reactor, followed by heating the reactor to 165° C. while the volatile toluene component was collected and removed. After 12 hours, the reactor was cooled and 200 more grams of dichlorobenzophenone (Aldrich 11,370 Aldrich) and toluene (500 milliliters) were added to the reactor and heated to 165° C. while the volatile toluene component was collected and removed. After 40 hours of heating at 165° C. with continuous stirring, an aliquot of the reaction product that had been precipitated into methanol was analyzed by gel permeation chromatography (gpc) (elution solvent was tetrahydrofuran) with the following results: $M_n$=4,260, $M_w$=6,650 Daltons. After 45 hours at 165° C. with continuous stirring, the reaction mixture was filtered to remove potassium carbonate, diluted with 4 liters of tetrahydrofuran, and precipitated into methanol/water (40 gallons/20 gallons). The polymer (poly(4-CPK-BPA)) was isolated in 90 percent yield after filtration and drying in vacuo. GPC analysis was as follows: $M_n$=4,800 $M_w$=7,560 Daltons. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from dichlorobenzophenone.

EXAMPLE IV

A polyarylene ether ketone of the formula

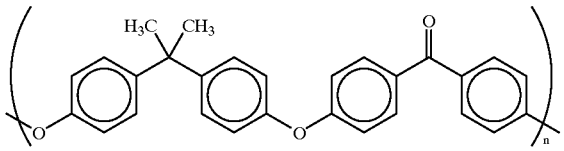

wherein n is between about 6 and about 30 (hereinafter referred to as poly(4-CPK-BPA)) was prepared as follows. A 5 gallon Parr Reactor equipped with a 500 milliliter Dean-Stark (Barrett) trap, condenser, mechanical stirrer, argon inlet, and stopper was assembled. 4,4'-Dichlorobenzophenone (Aldrich 11,370, Aldrich Chemical Co., Milwaukee, Wis., 800 grams), bis-phenol A (Aldrich 23,965-8, 982 grams), potassium carbonate (1,313 grams), anhydrous N,N-dimethylacetamide (5,600 milliliters), and toluene (630 milliliters) were added to the reactor, followed by heated the reactor to 165° C. while the volatile toluene component was collected and removed. After 12 hours, the reactor was cooled and 200 more grams of dichlorobenzophenone (Aldrich 11,370 Aldrich) and toluene (500 milliliters) were added to the reactor, followed by heating the reactor to 165° C. while the volatile toluene component was collected and removed. After 40 hours of heating at 165° C. with continuous stirring, an aliquot of the reaction product that had been precipitated into methanol was analyzed by gel permeation chromatography (gpc) (elution solvent was tetrahydrofuran) with the following results: $M_n$=4,500, $M_w$=8,720 Daltons. After 45 hours at 165° C. with continuous stirring, the reaction mixture was filtered to remove potassium carbonate, diluted with 4 liters of tetrahydrofuran, and precipitated into methanol/water (40 gallons/20 gallons). The polymer (poly(4-CPK-BPA)) was isolated in 84 percent yield after filtration and drying in vacuo. GPC analysis was as follows: $M_n$=5,560 $M_w$=10,800 Daltons. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from dichlorobenzophenone.

EXAMPLE V

A polyarylene ether ketone of the formula

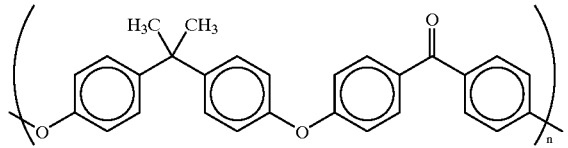

wherein n is between about 6 and about 30 (hereinafter referred to as poly(4-CPK-BPA)) was prepared as follows. A 5 gallon Parr Reactor equipped with a 500 milliliter Dean-Stark (Barrett) trap, condenser, mechanical stirrer, argon inlet, and stopper was assembled. 4,4'-Dichlorobenzophenone (Aldrich 11,370, Aldrich Chemical Co., Milwaukee, Wis. 800 grams), bis-phenol A (Aldrich 23,965-8, 982 grams), potassium carbonate (1,313 grams), anhydrous N,N-dimethylacetamide (6,000 milliliters), and toluene (630 milliliters) were added to the reactor, followed by heating the reactor to 165° C. while the volatile toluene component was collected and removed. After 12 hours, the reactor was cooled and 200 more grams of dichlorobenzophenone (Aldrich 11,370 Aldrich) and toluene (500 milliliters) were added to the reactor, followed by heating the reactor to 165° C. while the volatile toluene component was collected and removed. After 24 hours of heating at 165° C. with continuous stirring, an aliquot of the reaction product that had been precipitated into methanol was analyzed by gel permeation chromatography (gpc) (elution solvent was tetrahydrofuran) with the following results: $M_n$=2,670, $M_w$=4,300 Daltons. After 45 hours at 165° C. with continuous stirring, the reaction mixture was filtered to remove potassium carbonate, diluted with 4 liters of tetrahydrofuran, and precipitated into methanol/water (40 gallons/20 gallons). The polymer (poly(4-CPK-BPA)) was isolated in 90 percent yield after filtration and drying in vacuo. GPC analysis was as follows: $M_n$=6,500 $M_w$=12,900 Daltons. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from dichlorobenzophenone.

EXAMPLE VI

The polymer poly(4-CPK-BPA), prepared as described in Example I, was chloromethylated as follows.

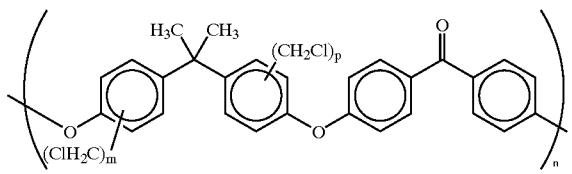

wherein n is about 9 and m and p are numbers the sum of which (m+p) average over the polymer about 1.7 (hereinafter referred to as poly(4-CPK-BPM)) was prepared as follows. Chloromethyl ethyl ether (Aldrich 14,267-0, 19.0 grams), 1,2-dichloroethane (Aldrich 43,756-5, 20 grams), acetyl chloride (Aldrich 23,957-7, 0.60 grams), methanol (0.05 grams), and tin tetrachloride (Aldrich 21,791-3, 0.67 grams) were added to a 250 milliliter 3-neck round-bottom flask equipped with an argon inlet, mechanical stirrer, and addition funnel. A solution of the polymer poly(4-CPK-BPA) (2.0 grams in 9 grams of 1,2-dichloroethane, prepared as described in Example I) was then added slowly to the solution over a period of one hour at room temperature. The reaction color changed from a light yellow to a dark wine red color following the addition of the polymer. The reaction, which was not exothermic, maintained a temperature of 27° C. throughout the course of the reaction. The reaction solution was allowed to stir for a total of 20 hours, followed by quenching of the sample by the addition of a small amount of methanol. The chloromethylated polymer was recovered in 95 percent yield (1.9 grams) by precipitation of the reaction mixture into a 50/50 mixture of hexanes and methanol and was analyzed by gel permeation chromatography with the following results: $M_n$=16,200, $M_w$=33,240 Daltons. Analysis by $^1$H NMR showed the polymer to have 1.70 chloromethyl groups per repeat unit.

EXAMPLE VII

The polymer poly(4-CPK-BPA), prepared as described in Example II, was chloromethylated as follows.

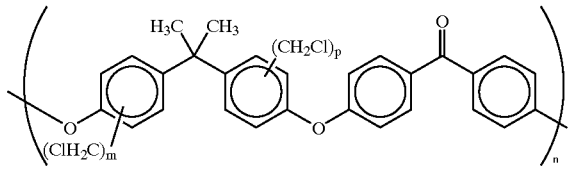

wherein n is about 9 and m and p are numbers the sum of which (m+p) average over the polymer about 1.4 (hereinafter referred to as poly(4-CPK-BPM)) was prepared as follows. Chloromethyl ethyl ether (Aldrich 14,267-0, 1,900.0 grams), 1,2-dichloroethane (Aldrich 43,756-5, 6,100 grams), acetyl chloride (Aldrich 23,957-7, 300 grams), methanol (30 grams), and tin tetrachloride (Aldrich 21,791-3, 285 grams) were added to a 22 Liter, 3-neck round-bottom flask equipped with an argon inlet, overhead mechanical stirrer, and metering pump connected to a reservoir flask. A solution of the polymer poly(4-CPK-BPA) (1,100 grams in 4,000 grams of 1,2-dichloroethane) was added to the solution with the metering pump over a period of one hour at room temperature. The reaction color changed from a light yellow to a dark wine red color following the addition of the polymer. The reaction, which was not exothermic, maintained a temperature of 27° C. throughout the course of the reaction. The reaction solution was allowed to stir for a total of 15 hours, followed by quenching of the sample by the addition of a small amount of methanol. The polymer was recovered in 95 percent yield (1,050 grams) by precipitation of the reaction mixture into a 50/50 mixture of hexanes and methanol and analyzed by gel permeation chromatography with the following results: $M_n$=9,400, $M_w$=14,200 Daltons. Analysis by $^1$H NMR showed the polymer to have 1.40 chloromethyl groups per repeat unit.

EXAMPLE VIII

The polymer poly(4-CPK-BPA), prepared as described in Example III, was chloromethylated as follows.

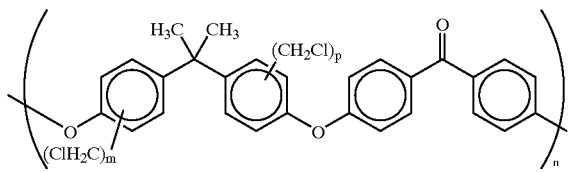

wherein n is about 9 and m and p are numbers the sum of which (m+p) average over the polymer about 1.5 to about 1.6 (hereinafter referred to as poly(4-CPK-BPM)) was prepared as follows. Chloromethyl ethyl ether (Aldrich 14,267-0, 1,615.0 grams), 1,2-dichloroethane (Aldrich 43,756-5, 6,500 grams), acetyl chloride (Aldrich 23,957-7, 250 grams), methanol (15 grams), and tin tetrachloride (Aldrich 21,791-3, 285 grams) were added to a 22 Liter, 3-neck round-bottom flask equipped with an argon inlet, overhead mechanical stirrer, and metering pump connected to a reservoir flask. A solution of the polymer poly(4-CPK-BPA) (850 grams in 4,000 grams of 1,2-dichloroethane) was added slowly to the solution with the metering pump over a period of one hour at room temperature. The reaction color changed from a light yellow to a dark wine red color following the addition of the polymer. The reaction, which was not exothermic, maintained a temperature of 27° C. throughout the course of the reaction. The reaction solution was allowed to stir for a total of 10 hours, followed by quenching of the sample by the addition of a small amount of methanol. The polymer was recovered in 90 percent yield (800 grams) by precipitation of the reaction mixture into a 50/50 mixture of hexanes and methanol and analyzed by gel permeation chromatography with the following results: $M_n$=5,600, $M_w$=8,790 Daltons. Analysis by $^1$H NMR showed the polymer to have 1.57 chloromethyl groups per repeat unit.

EXAMPLE IX

The polymer poly(4-CPK-BPA), prepared as described in Example III, was chloromethylated as follows.

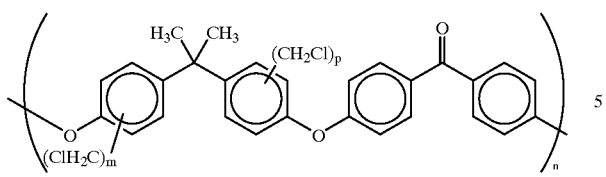

wherein n is about 9 and m and p are numbers the sum of which (m+p) average over the polymer about 1.7 to about 1.8 (hereinafter referred to as poly(4-CPK-BPM)) was prepared as follows. Chloromethyl ethyl ether (Aldrich 14,267-0, 1,615.0 grams), 1,2-dichloroethane (Aldrich 43,756-5, 6,500 grams), acetyl chloride (Aldrich 23,957-7, 250 grams), methanol (15 grams), and tin tetrachloride (Aldrich 21,791-3, 285 grams) were added to a 22 Liter, 3-neck round-bottom flask equipped with an argon inlet, overhead mechanical stirrer, and metering pump connected to a reservoir flask. A solution of the polymer poly(4-CPK-BPA) (850 grams in 4,000 grams of 1,2-dichloroethane) was added slowly to the solution with the metering pump over a period of one hour at room temperature. The reaction color changed from a light yellow to a dark wine red color following the addition of the polymer. The reaction, which was not exothermic, maintained a temperature of 27° C. throughout the course of the reaction. The reaction solution was allowed to stir for a total of 30 hours, followed by quenching the sample by the addition of a small amount of methanol. The polymer was recovered in 90 percent yield (800 grams) by precipitation of the reaction mixture into a 50/50 mixture of hexanes and methanol and analyzed by gel permeation chromatography with the following results: $M_n$=10,230, $M_w$=22,200 Daltons. Analysis by $^1$H NMR showed the polymer to have 1.72 chloromethyl groups per repeat unit.

EXAMPLE X

Poly(4-CPK-BPM) with 2 chloromethyl groups per repeat unit (1,000 grams, prepared as described in Example VII) in 20 kilograms of N,N'-dimethylacetamide was mechanically stirred in a closed pope-tank reactor with sodium acrylate (Aldrich 40,822-0, 600 grams) for 120 hours at 25° C. The solution was handled in yellow light and added to an excess of methanol (100 kilograms) with mechanical stirring to precipitate the polymer. Approximately 60 percent of the chloromethyl groups were replaced with acrylolyl groups, as analyzed by $^1$H NMR. The molecular weight of the resulting polymer was estimated by gel permeation chromatography with the following results: $M_n$=8,870, $M_w$=20,760 Daltons.

Other embodiments and modifications of the present invention may occur to those of ordinary skill in the art subsequent to a review of the information presented herein; these embodiments and modifications, as well as equivalents thereof, are also included within the scope of this invention.

What is claimed is:

1. A process which comprises reacting a polymer of the general formula

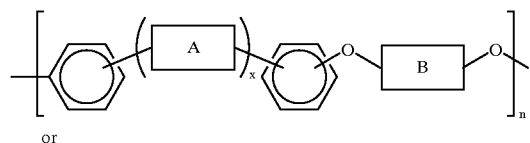

or

-continued

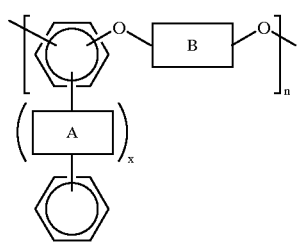

wherein x is an integer of 0 or 1, A is

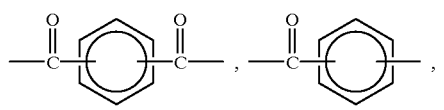

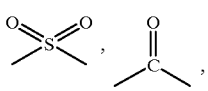

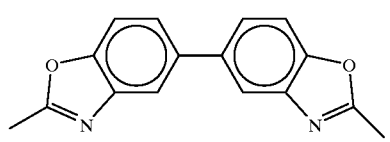

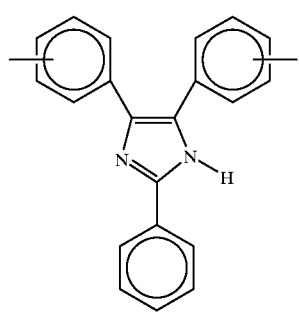

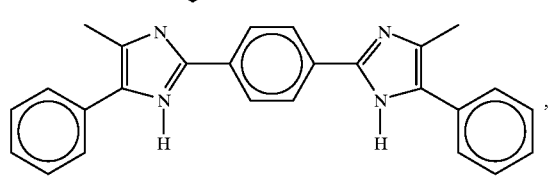

or mixtures thereof, B is

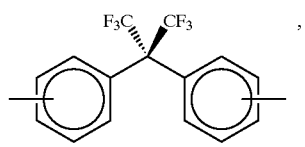

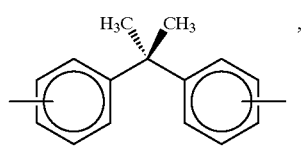

-continued
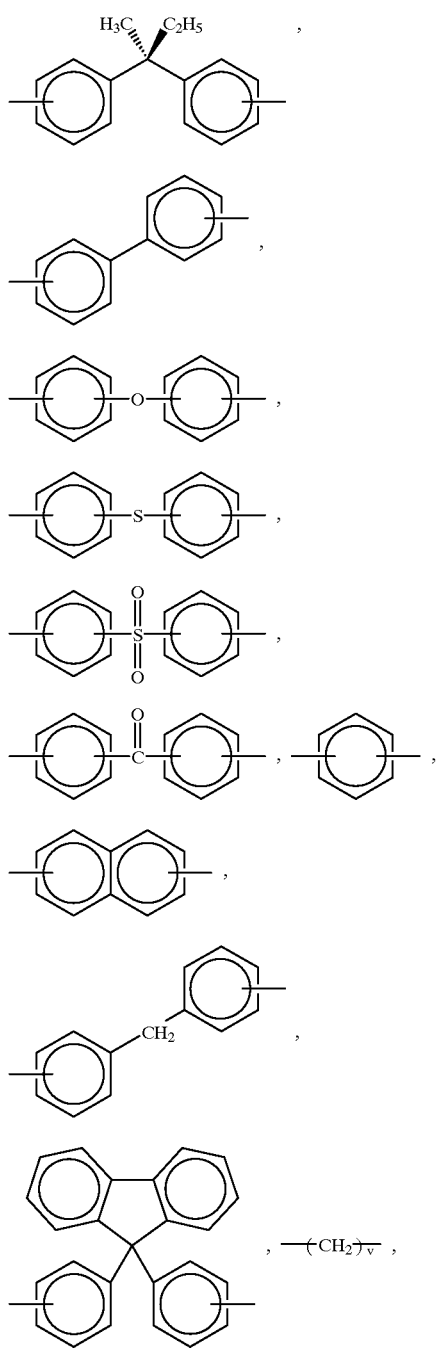
wherein v is an integer of from 1 to about 20,
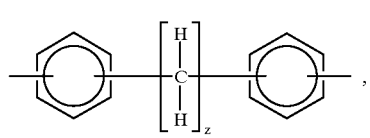
wherein z is an integer of from 2 to about 20,
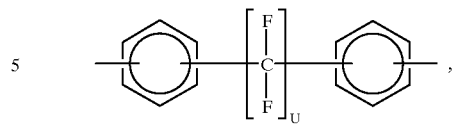
wherein u is an integer of from 1 to about 20,
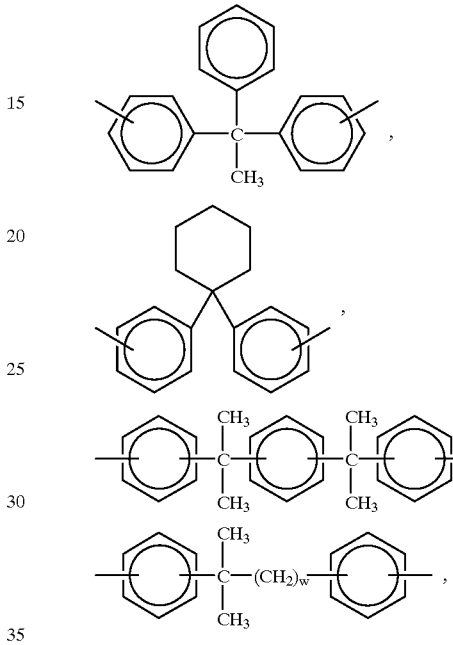
wherein w is an integer of from 1 to about 20,
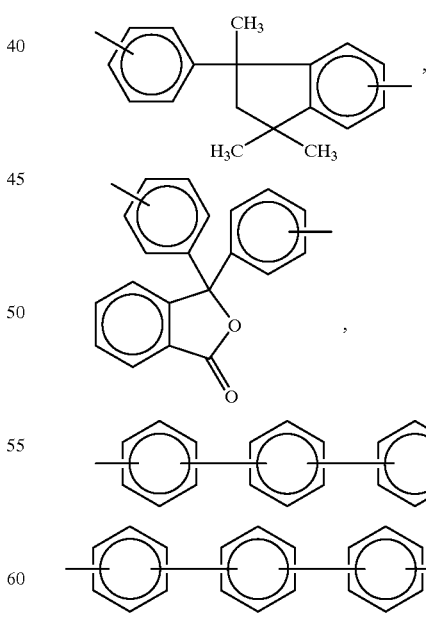
or mixtures thereof, and n is an integer representing the number of repeating monomer units, with a halomethyl alkyl ether, an acetyl halide, and methanol in the presence of a halogen-containing Lewis acid catalyst, thereby forming a halomethylated polymer.

2. A polymer prepared by the process of claim 1.

3. A process which comprises preparing a halomethylated polymer by the process of claim 1 and converting at least some of the halomethyl groups to photosensitivity-imparting groups which enable crosslinking or chain extension of the polymer upon exposure to actinic radiation, thereby forming a photopatternable polymer.

4. A polymer prepared by the process of claim 3.

5. A process according to claim 3 further comprising causing the polymer to become crosslinked or chain extended through the photosensitivity-imparting groups.

6. A process according to claim 5 wherein crosslinking or chain extension is effected by heating the polymer to a temperature sufficient to enable the photosensitivity-imparting groups to form crosslinks or chain extensions in the polymer.

7. A process according to claim 5 wherein crosslinking or chain extension is effected by exposing the polymer to actinic radiation such that the polymer in exposed areas becomes crosslinked or chain extended.

8. A process according to claim 7 wherein the polymer is exposed in an imagewise pattern such that the polymer in exposed areas becomes crosslinked or chain extended and the polymer in unexposed areas does not become crosslinked or chain extended, and wherein subsequent to exposure, the polymer in the unexposed areas is removed from the crosslinked or chain extended polymer, thereby forming an image pattern.

9. A process according to claim 8 further comprising:
  (a) prior to crosslinking or chain extension, depositing a layer comprising the polymer onto a lower substrate in which one surface thereof has an array of heating elements and addressing electrodes having terminal ends formed thereon, said polymer being deposited onto the surface having the heating elements and addressing electrodes thereon;
  (b) exposing the layer to actinic radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;
  (c) removing the polymer from the unexposed areas, thereby forming recesses in the layer, said recesses exposing the heating elements and the terminal ends of the addressing electrodes;
  (d) providing an upper substrate with a set of parallel grooves for subsequent use as ink channels and a recess for subsequent use as a manifold, the grooves being open at one end for serving as droplet emitting nozzles; and
  (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

10. A process according to claim 1 further comprising causing the polymer to become crosslinked or chain extended through the halomethyl groups by heating the polymer to a temperature sufficient to enable the halomethyl groups to form crosslinks or chain extensions in the polymer.

11. A process according to claim 1 further comprising causing the polymer to become crosslinked or chain extended through the halomethyl groups by exposing the polymer to a radiation source which is electron beam radiation, x-ray radiation, or deep ultraviolet radiation.

12. A process according to claim 11 wherein the polymer is exposed in an imagewise pattern such that the polymer in exposed areas becomes crosslinked or chain extended and the polymer in unexposed areas does not become crosslinked or chain extended, and wherein subsequent to exposure, the polymer in the unexposed areas is removed from the crosslinked or chain extended polymer, thereby forming an image pattern.

13. A process according to claim 12 further comprising:
  (a) prior to crosslinking or chain extension, depositing a layer comprising the polymer onto a lower substrate in which one surface thereof has an array of heating elements and addressing electrodes having terminal ends formed thereon, said polymer being deposited onto the surface having the heating elements and addressing electrodes thereon;
  (b) exposing the layer to a radiation source which is electron beam radiation, x-ray radiation, or deep ultraviolet radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;
  (c) removing the polymer from the unexposed areas, thereby forming recesses in the layer, said recesses exposing the heating elements and the terminal ends of the addressing electrodes;
  (d) providing an upper substrate with a set of parallel grooves for subsequent use as ink channels and a recess for subsequent use as a manifold, the grooves being open at one end for serving as droplet emitting nozzles; and
  (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

14. A process which comprises the steps of:
  (a) preparing a photopatternable polymer having halomethyl substituents by the process of claim 1;
  (b) depositing a layer comprising a photopatternable polymer onto a lower substrate in which one surface thereof has an array of heating elements and addressing electrodes having terminal ends formed thereon, said photopatternable polymer being deposited onto the surface having the heating elements and addressing electrodes thereon;
  (c) exposing the layer to actinic radiation in an imagewise pattern such that the photopatternable polymer in exposed areas becomes crosslinked or chain extended and the photopatternable polymer in unexposed areas does not become crosslinked or chain extended, wherein the unexposed areas correspond to areas of the lower substrate having thereon the heating elements and the terminal ends of the addressing electrodes;
  (d) removing the photopatternable polymer from the unexposed areas, thereby forming recesses in the layer, said recesses exposing the heating elements and the terminal ends of the addressing electrodes;

(e) providing an upper substrate with a set of parallel grooves for subsequent use as ink channels and a recess for subsequent use as a manifold, the grooves being open at one end for serving as droplet emitting nozzles; and (f) aligning, mating, and bonding the upper and lower substrates together to form a printhead with the grooves in the upper substrate being aligned with the heating elements in the lower substrate to form droplet emitting nozzles, thereby forming a thermal ink jet printhead, wherein at least one of the layers comprising the photopatternable polymer and the upper substrate comprise the polymer prepared in step (a), and wherein, when the photopatternable polymer has halomethyl substituents, the actinic radiation is electron beam radiation, x-ray radiation, or deep ultraviolet radiation.

15. A process which comprises the steps of:

(a) preparing a photopatternable polymer by the process of claim 3;

(b) depositing a layer comprising a photopatternable polymer onto a lower substrate in which one surface thereof has an array of heating elements and addressing electrodes having terminal ends formed thereon, said photopatternable polymer being deposited onto the surface having the heating elements and addressing electrodes thereon;

(c) exposing the layer to actinic radiation in an imagewise pattern such that the photopatternable polymer in exposed areas becomes crosslinked or chain extended and the photopatternable polymer in unexposed areas does not become crosslinked or chain extended, wherein the unexposed areas correspond to areas of the lower substrate having thereon the heating elements and the terminal ends of the addressing electrodes;

(d) removing the photopatternable polymer from the unexposed areas, thereby forming recesses in the layer, said recesses exposing the heating elements and the terminal ends of the addressing electrodes;

(e) providing an upper substrate with a set of parallel grooves for subsequent use as ink channels and a recess for subsequent use as a manifold, the grooves being open at one end for serving as droplet emitting nozzles; and (f) aligning, mating, and bonding the upper and lower substrates together to form a printhead with the grooves in the upper substrate being aligned with the heating elements in the lower substrate to form droplet emitting nozzles, thereby forming a thermal ink jet printhead, wherein at least one of the layers comprising the photopatternable polymer and the upper substrate comprise the polymer prepared in step (a).

16. A process according to claim 1 wherein A is

and B is

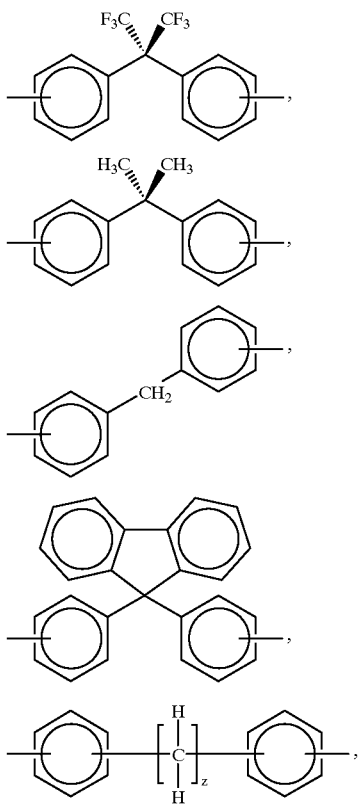

wherein z is an integer of from 2 to about 20, or a mixture thereof.

17. A process according to claim 1 wherein the polymer has end groups derived from the "A" groups of the polymer.

18. A process according to claim 1 wherein the polymer has end groups derived from the "B" groups of the polymer.

19. A process according to claim 1 wherein the alkyl group of the halomethyl alkyl ether has from 2 to about 8 carbon atoms.

20. A process according to claim 1 wherein the halomethyl alkyl ether is a halomethyl ethyl ether.

21. A process according to claim 1 wherein the halomethyl alkyl ether is a chloromethyl alkyl ether, the acetyl halide is acetyl chloride, and the halogen-containing Lewis acid catalyst is a chlorine-containing Lewis acid catalyst.

22. A process according to claim 1 wherein the reaction takes place in a chlorinated solvent.

23. A process according to claim 22 wherein the chlorinated solvent is 1,2-dichloroethane.

24. A process according to claim 1 wherein the reaction takes place at a temperature of from about 10 to about 100° C.

25. A process according to claim 1 wherein the reaction takes place at a temperature of from about 15 to about 30° C.

26. A process according to claim 1 wherein the unhalomethylated starting polymer has a weight average molecular weight of from about 1,000 to about 100,000.

27. A process according to claim 1 wherein the unhalomethylated starting polymer has a weight average molecular weight of from about 3,000 to about 25,000.

28. A process according to claim 1 wherein the resulting halomethylated polymer has a weight average molecular weight of from about 3,000 to about 30,000.

29. A process according to claim 1 wherein the resulting halomethylated polymer has a weight average molecular weight of from about 17,000 to about 22,000.

30. A process according to claim 1 wherein the Lewis acid catalyst is of the general formula $$M^{n\oplus}X_n^{\ominus}$$

wherein n is an integer of 1, 2, 3, 4, or 5, M represents a boron atom or a metal atom, and X represents a halogen atom.

31. A process according to claim 1 wherein the resulting halomethylated polymer has at least about 0.5 halomethyl groups per monomer repeat unit.

32. A process according to claim 1 wherein the resulting halomethylated polymer has at least about 1.0 halomethyl groups per monomer repeat unit.

33. A process according to claim 1 wherein the resulting halomethylated polymer has at least about 1.5 halomethyl groups per monomer repeat unit.

* * * * *